US010254798B2

(12) United States Patent
Fujimoto

(10) Patent No.: US 10,254,798 B2
(45) Date of Patent: Apr. 9, 2019

(54) DISPLAY DEVICE

(71) Applicant: Sharp Kabushiki Kaisha, Sakai, Osaka (JP)

(72) Inventor: Hidetoshi Fujimoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/527,327

(22) PCT Filed: Nov. 10, 2015

(86) PCT No.: PCT/JP2015/081563
§ 371 (c)(1),
(2) Date: May 17, 2017

(87) PCT Pub. No.: WO2016/080239
PCT Pub. Date: May 26, 2016

(65) Prior Publication Data

US 2017/0322598 A1 Nov. 9, 2017

(30) Foreign Application Priority Data

Nov. 18, 2014 (JP) ................................ 2014-233649

(51) Int. Cl.

| | |
|---|---|
| ***H05K 5/02*** | (2006.01) |
| ***H05K 5/00*** | (2006.01) |
| ***H05K 1/02*** | (2006.01) |
| ***G06F 1/16*** | (2006.01) |
| ***G06F 3/041*** | (2006.01) |

(52) U.S. Cl.
CPC .......... *G06F 1/1652* (2013.01); *G06F 1/1626* (2013.01); *G06F 1/1641* (2013.01); *G06F 1/1643* (2013.01); *G06F 1/1681* (2013.01); *G06F 3/0412* (2013.01); *G06F 3/0416* (2013.01); *H01L 2251/5338* (2013.01)

(58) Field of Classification Search
CPC ...... F21V 21/30; B65D 85/38; H05K 5/0017; H05K 5/0226; G06F 1/1679; G06F 1/1681
See application file for complete search history.

(56) References Cited

U.S. PATENT DOCUMENTS

| | | | |
|---|---|---|---|
| 2002/0104769 A1 | 8/2002 | Kim et al. | |
| 2012/0236484 A1 | 9/2012 | Sharp | |
| 2015/0378397 A1* | 12/2015 | Park ...................... | G06F 1/1652 361/679.27 |

FOREIGN PATENT DOCUMENTS

| | | |
|---|---|---|
| EP | 2680547 A2 | 1/2014 |
| EP | 2690521 A1 | 1/2014 |
| JP | 2006-287982 A | 10/2006 |

(Continued)

*Primary Examiner* — Changhyun Yi
(74) *Attorney, Agent, or Firm* — ScienBiziP, P.C.

(57) ABSTRACT

A display device includes a foldable case unit and a flexible display panel. The case unit includes an elongated connecting plate, and a lower case and an upper case coupled to the connecting plate via hinge parts, respectively. The upper case has a variable dimension in a y direction. In the opened case unit, the lower case, the connecting plate, and the upper case are aligned flush with one another in the y direction. In the folded case unit, the dimension of the upper case in the y direction is larger than the dimension in the opened case unit, and the display panel is accommodated in a space surrounded with the lower case, the connecting plate, and the upper case.

15 Claims, 27 Drawing Sheets

(56) References Cited

FOREIGN PATENT DOCUMENTS

| | | | |
|---|---|---|---|
| JP | 4035051 | B2 | 1/2008 |
| JP | 2011-119830 | A | 6/2011 |

* cited by examiner

DISPLAY DEVICE

TECHNICAL FIELD

The present invention relates to a foldable display device.

BACKGROUND ART

Foldable display devices have been developed in recent years. A particular demand for larger screens leads to development of a display device including foldable two cases each provided with a display.

Patent Literatures 1 and 2 describe a foldable mobile terminal including a first case having a first display, and a second case having a second display. The first and second cases are connected to each other at a hinge part so as to be foldable at the hinge part to be opened and closed.

The display device described in Patent Literatures 1 and 2 includes the displays provided respectively in the two cases. The two displays form a boundary therebetween which cannot be disregarded. If a single flexible display is applied to a foldable structure to eliminate such a boundary, the display receives a large load at a folded portion.

Patent Literature 3 discloses a display device including first to third cases and a single flexible display extending from the second case to the third case. The first case according to Patent Literature 3 is provided for an electronic circuit. The first and second cases are connected to each other via a hinge part so as to be foldable at the hinge part. The second and third cases are made of a plastic material, each include opposite side walls having a bellows sectional shape, and are connected to each other via an expandable hinge part having a hollow interior. The display device is folded by interposing the first case between the second and third cases in a state where the first and second cases are stacked. This configuration prevents the display provided across the second and third cases from being folded at an acute angle, and secures long durability of the display.

Patent Literature 4 discloses a display device including two cases connected to be foldable at a hinge unit, a flexible display unit such as an organic EL display panel, and an elastic sheet member disposed on the rear surface of the display unit. The elastic sheet member is fixed to a first one of the cases so as to be slidable with respect to a second one of the cases. This configuration releases stress applied to a folded mobile phone and protects the display unit.

CITATION LIST

Patent Literatures

Patent Literature 1: JP 4035051 B1
Patent Literature 2: JP 2011-119830 A
Patent Literature 3: JP 2006-287982 A
Patent Literature 4: JP 2005-114759 A

SUMMARY OF INVENTION

Technical Problems

The display device according to Patent Literature 3 needs the first case not related to the display foldable structure, so that the entire display device has a large non-display area. Furthermore, the display device according to Patent Literature 3 includes the hinge part that is provided between the first and second cases and is visible to a user, and thus does not have excellent appearance. Furthermore, the plastic hollow bellows structure cannot assure that the second and third cases are connected with sufficient strength.

The display device according to Patent Literature 4 needs a display accommodating portion, so that the entire display device has a large non-display area. The display device according to Patent Literature 4 in use includes the hinge part visible to a user, and thus does not have excellent appearance.

It is an object of the present invention to provide a foldable display device that includes a display having no joint, has a large display area, achieves excellent appearance, and is restrained from wrinkling when folded.

Solution to Problems

A display device according to the present invention includes a foldable case unit and a flexible display panel. The case unit includes an elongated connecting plate, a first support member having a tubular shape and coupled to a first one of long sides of the connecting plate via a first hinge part, and a second support member having a tubular shape, coupled to a second one of the long sides of the connecting plate via a second hinge part, and having a variable dimension perpendicular to a longitudinal direction of the connecting plate. When the case unit is opened to allow the first and second support members to be flush with each other, the first support member, the connecting plate, and the second support member are aligned flush with one another in the direction perpendicular to the longitudinal direction of the connecting plate. When the case unit is folded to allow the first and second support members to face each other, the dimension of the second support member in the direction perpendicular to the longitudinal direction of the connecting plate is larger than the dimension in the opened case unit, and the display panel is accommodated in a space surrounded with the first and second support members and the connecting plate.

Advantageous Effects of Invention

The present invention provides a foldable display device that includes a display having no joint, has a large display area, achieves excellent appearance, and is restrained from wrinkling when folded.

DESCRIPTION OF EMBODIMENTS

Figure 1:
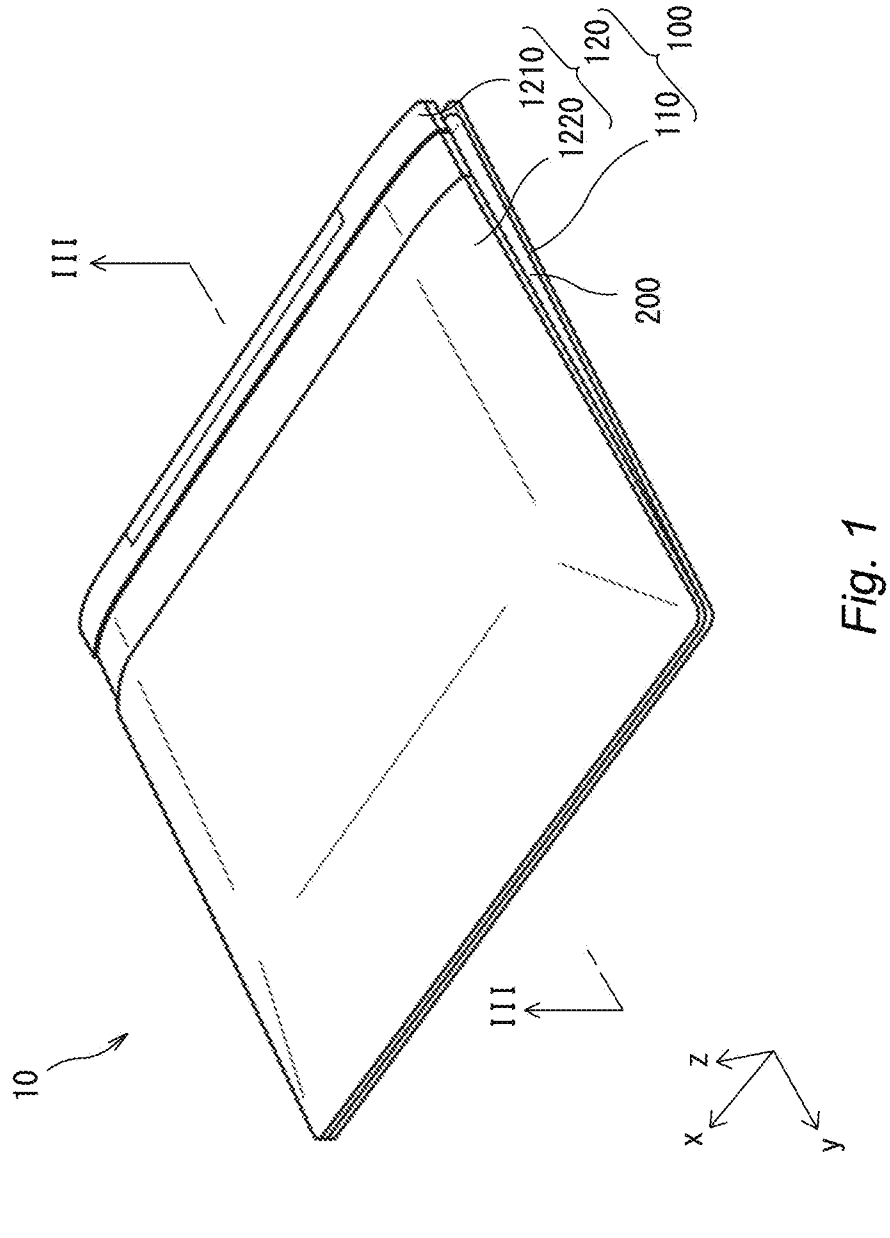
FIG. 1 is a perspective view of a display device in a closed state.

The present invention provides a display device including a foldable case unit and a flexible display panel. The case unit includes an elongated connecting plate, a first support member having a tubular shape and coupled to a first one of long sides of the connecting plate via a first hinge part, and a second support member having a tubular shape, coupled to a second one of the long sides of the connecting plate via a second hinge part, and having a variable dimension perpendicular to a longitudinal direction of the connecting plate. When the case unit is opened to allow the first and second support members to be flush with each other, the first support member, the connecting plate, and the second support member are aligned flush with one another in the direction perpendicular to the longitudinal direction of the connecting plate. When the case unit is folded to allow the first and second support members to face each other, the dimension of the second support member in the direction perpendicular to the longitudinal direction of the connecting plate is larger than the dimension in the opened case unit, and the display panel is accommodated in a space surrounded with the first and second support members and the connecting plate (a first configuration).

The second support member in the first configuration has the variable length (dimension perpendicular to the longitudinal direction of the connecting plate). In the state where the first support member, the connecting plate, and the second support member are positioned flush with one another in the opened display device, decrease in length of the second support member allows a sum of lengths of the first support member, the connecting plate, and the second support member to substantially be equal to a length of the display panel. Increase in length of the second support member in the folded display device allows the sum of the lengths of the first support member, the connecting plate, and the second support member to be larger than the length of the display panel. The display panel can thus be bent without following corner angles at a bent portion of the case unit. The display panel is bent without following the corner angles of the case unit to have a curvature necessary for bending and be restrained from wrinkling.

The display device having the first configuration is foldable into the opened state and the closed state with the display panel being restrained from wrinkling as described above. The first and second support members are not each provided with a separate display panel but are provided with the single display panel to enable display with no joint. The single display panel enabling display with no joint achieves display having excellent appearance with a hidden coupling portion such as the connecting plate between the first and second support members. The single display panel enabling display with no joint further secures a large display area with respect to the dimensions of the case unit.

The present invention provides a display device having a second configuration, in which the second member in the first configuration includes a first member coupled to the second one of the long sides of the connecting plate via the second hinge part, and a second member coupled to the first member via an elastic member and disposed flush with the first member. In the display device having the second configuration, the dimension of the second support member in the direction perpendicular to the longitudinal direction of the connecting plate is varied in accordance with variation in distance between the first and second members caused by expansion or contraction of the elastic member.

The second support member in the second configuration can be varied in dimension perpendicular to the longitudinal direction of the connecting plate by expansion or contraction of the elastic member with no complex configuration.

The present invention provides a display device having a third configuration, in which the display panel in the second configuration is fixed to the first support member and the second member.

The display panel is fixed to the second member in the third configuration. The second support member is thus varied in dimension perpendicular to the longitudinal direction of the connecting plate by relative shift between the first member and the display panel. The first and second members are coupled to each other via the elastic member. When the case unit is opened or closed, elastic force of the elastic member varies to vary the relative position of the first member to the display panel and vary the length of the second support member. The first support member and the second member are fixed to the display panel, so that the case unit can be opened and closed with no protrusion of the display panel from the case unit.

The present invention provides a display device having a fourth configuration, in which a first one of the first and second members in the second or third configuration has a recess accommodating part of a second one of the first and second members. In the display device having the fourth configuration, the part of the second one accommodated in the recess is varied in depth to vary the dimension of the second support member in the direction perpendicular to the longitudinal direction of the connecting plate.

The first one of the first and second members in the fourth configuration has the recess accommodating part of the second one of the first and second members. The first and second members are thus restrained in relative disposition so as to be positioned flush with each other.

The present invention provides a display device having a fifth configuration, in which the recess in the fourth configuration is provided at the second member.

The recess is provided at the second member in the fifth configuration. The second support member thus has a surface configured by the second member in the portion of the first member accommodated in the recess of the second member. This configuration thus secures a large portion fixing the second member and the display panel.

The present invention provides a display device having a sixth configuration, in which, in the third configuration, the first member is smaller than the second member in dimension perpendicular to the longitudinal direction of the connecting plate.

In the sixth configuration, the dimension of the first member is smaller than the dimension of the second member in the direction perpendicular to the longitudinal direction of the connecting plate. This configuration thus secures a large portion fixing the second member and the display panel.

The present invention provides a display device having a seventh configuration, in which, in any one of the first to sixth configurations, the dimension of the second support member has a maximum value substantially equal to a dimension of the first support member in the direction perpendicular to the longitudinal direction of the connecting plate.

In the seventh configuration, the maximum value of the length of the second support member is substantially equal to the length of the first support member in the direction perpendicular to the longitudinal direction of the connecting plate. In the folded display device, the first and second support members can thus face each other with ends of the first and second support members being aligned.

The present invention provides a display device having an eighth configuration, in which, in any one of the first to seventh configurations, a sum of a minimum value of the dimension of the second support member and a dimension of the connecting plate is substantially equal to the dimension of the first support member in the direction perpendicular to the longitudinal direction of the connecting plate.

In the eighth configuration, the sum of the minimum value of the length of the second support member and the length of the connecting plate is substantially equal to the length of the first support member in the direction perpendicular to the longitudinal direction of the connecting plate. In the state where the first support member, the connecting plate, and the second support member are aligned flush with one another in the opened display device, the lengths of the first support member, the connecting plate, and the second support member can substantially be equalized to the length of the display panel.

The present invention provides a display device having a ninth configuration suitable for a flexible organic EL display panel.

The flexible organic EL display panel has excellent flexibility to allow the display panel to be bent at a small curvature. The ninth configuration thus achieves a small thickness of the folded display device.

The present invention provides a display device having a tenth configuration including a foldable case unit and a flexible display panel. The case unit includes an elongated connecting plate, a first support member having a tubular shape and coupled to a first one of long sides of the connecting plate via a first hinge part, and a second support member having a tubular shape, coupled to a second one of the long sides of the connecting plate via a second hinge part, and having a variable dimension perpendicular to a longitudinal direction of the connecting plate. The second support member includes a first member coupled to the second one of the long sides of the connecting plate via the second hinge part, and a second member disposed flush with the first member. A first one of the first and second members has a recess accommodating part of a second one of the first and second members. The recess has an inner wall surface coupled to the part of the second one via an elastic member.

The second support member in the tenth configuration includes the first member coupled to the second one of the long sides of the connecting plate via the second hinge part, and the second member disposed flush with the first member. The first one of the first and second members has the recess accommodating part of the second one of the first and second members. The inner wall surface of the recess and the part of the second one are coupled to each other via the elastic member. The second support member can thus be varied in dimension perpendicular to the longitudinal direction of the connecting plate. Accordingly, when the case unit is opened to allow the first and second support members to be flush with each other, the first support member, the connecting plate, and the second support member are aligned flush with one another in the direction perpendicular to the longitudinal direction of the connecting plate. When the case unit is folded to allow the first and second support members to face each other, the dimension of the second support member in the direction perpendicular to the longitudinal direction of the connecting plate is larger than the dimension in the opened case unit, and the display panel is accommodated in a space surrounded with the first and second support members and the connecting plate. The display panel can thus be bent without following the corner angles at the bent portion of the case unit. The display panel is bent without following the corner angles of the case unit to have a curvature necessary for bending and be restrained from wrinkling.

The display device having the tenth configuration is foldable with the display panel being restrained from wrinkling as described above. The first and second support members are not each provided with a separate display panel but are provided with the single display panel to enable display with no joint. The single display panel enabling display with no joint achieves display having excellent appearance with a hidden coupling portion such as the connecting plate between the first and second support members. The single display panel enabling display with no joint further secures a large display area with respect to the dimensions of the case unit.

Preferred embodiments of the present invention will now be detailed below with reference to the drawings. For easier description, the drawings to be referred to in the following description depict only simplified major members necessary for the description of the present invention, out of constituent members according to the embodiments of the present invention. The present invention can thus include appropriate constituent members not depicted in the drawings. The members in the drawings are not accurately depicted with actual dimensions, at actual dimensional ratios, or the like.

Embodiment 1

(Display Device)

Figure 2:
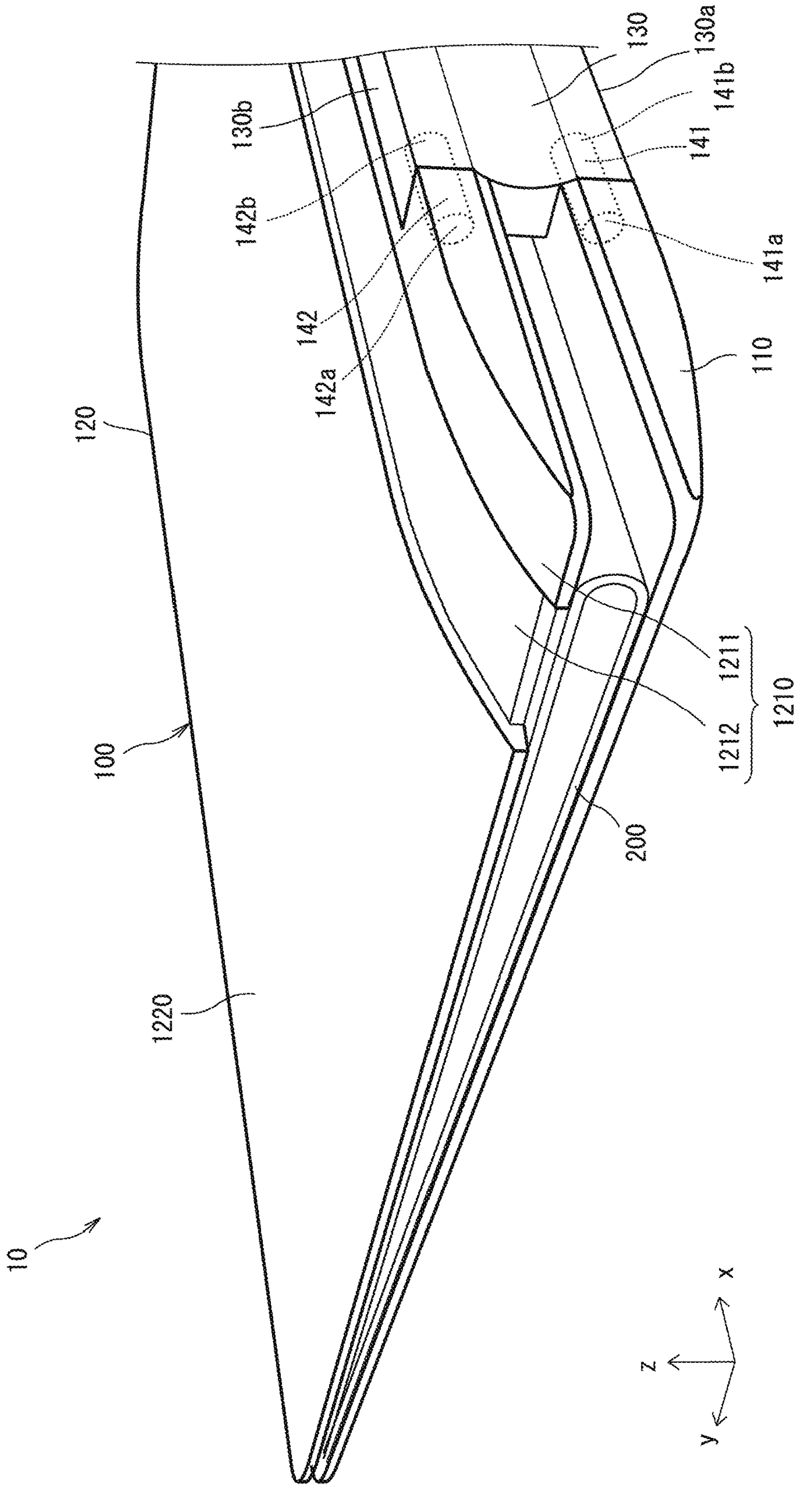
FIG. 2 is another perspective view of the display device in the closed state.
Figure 3:
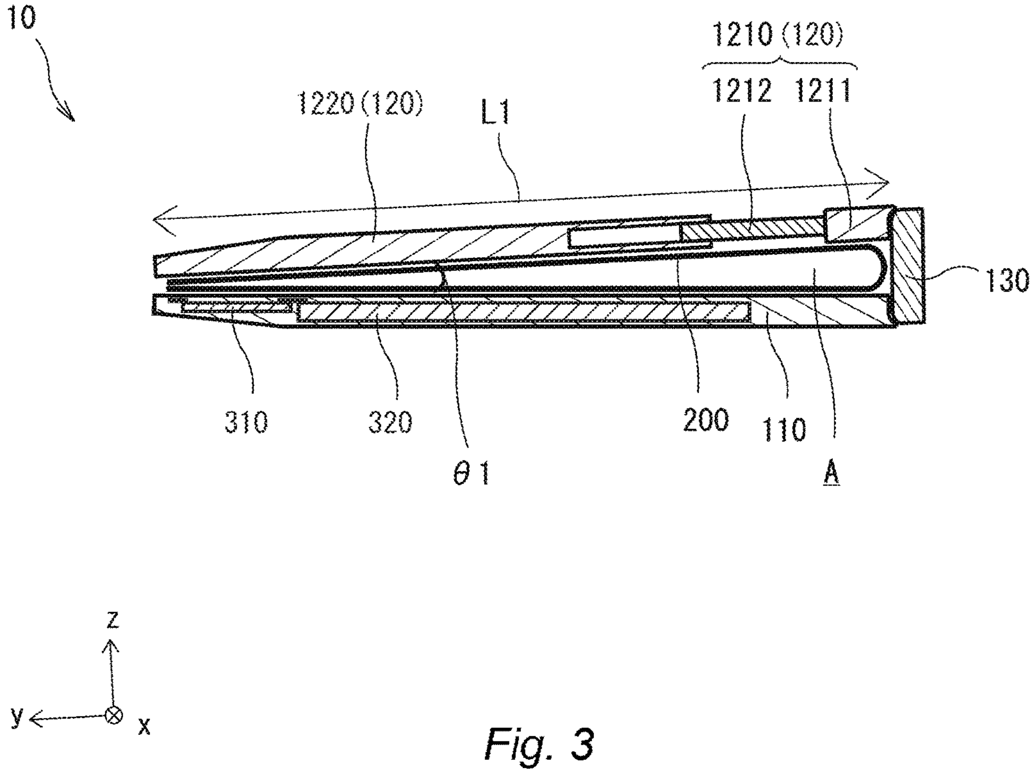
FIG. 3 is a sectional view taken along line indicated in FIG. 1.
Figure 4:
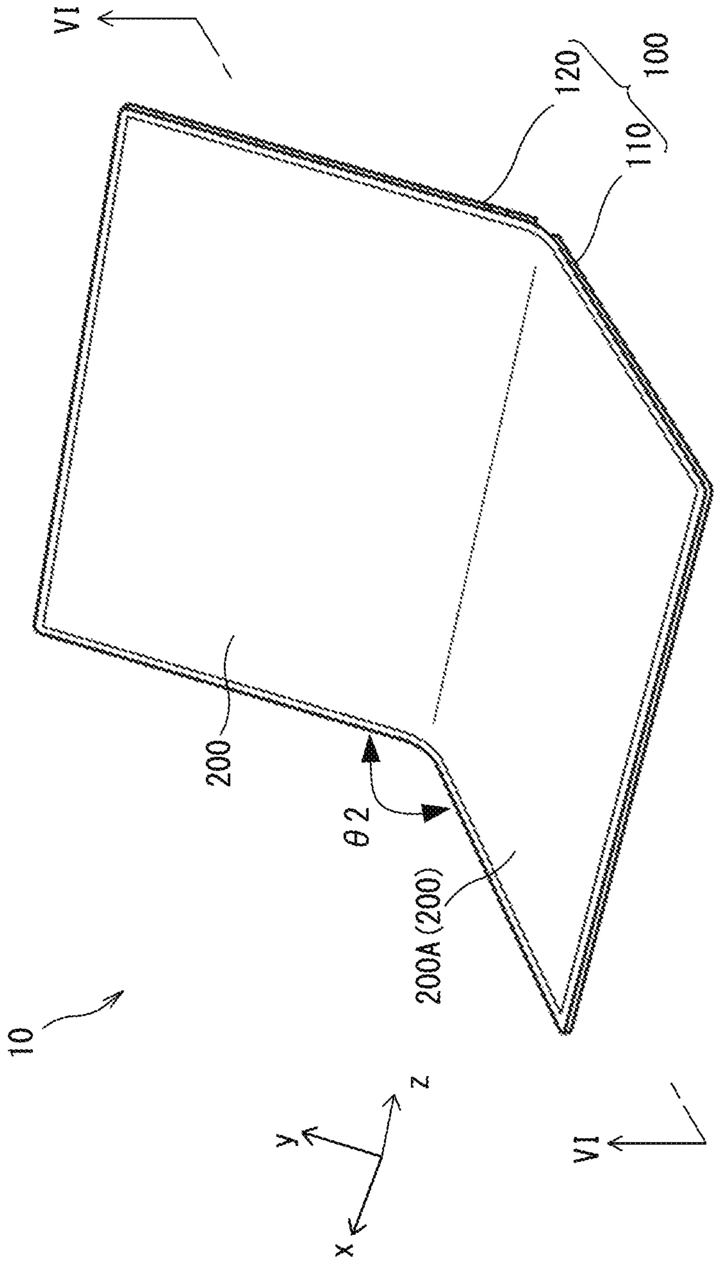
FIG. 4 is a perspective view of the display device in an opened state.
Figure 5:
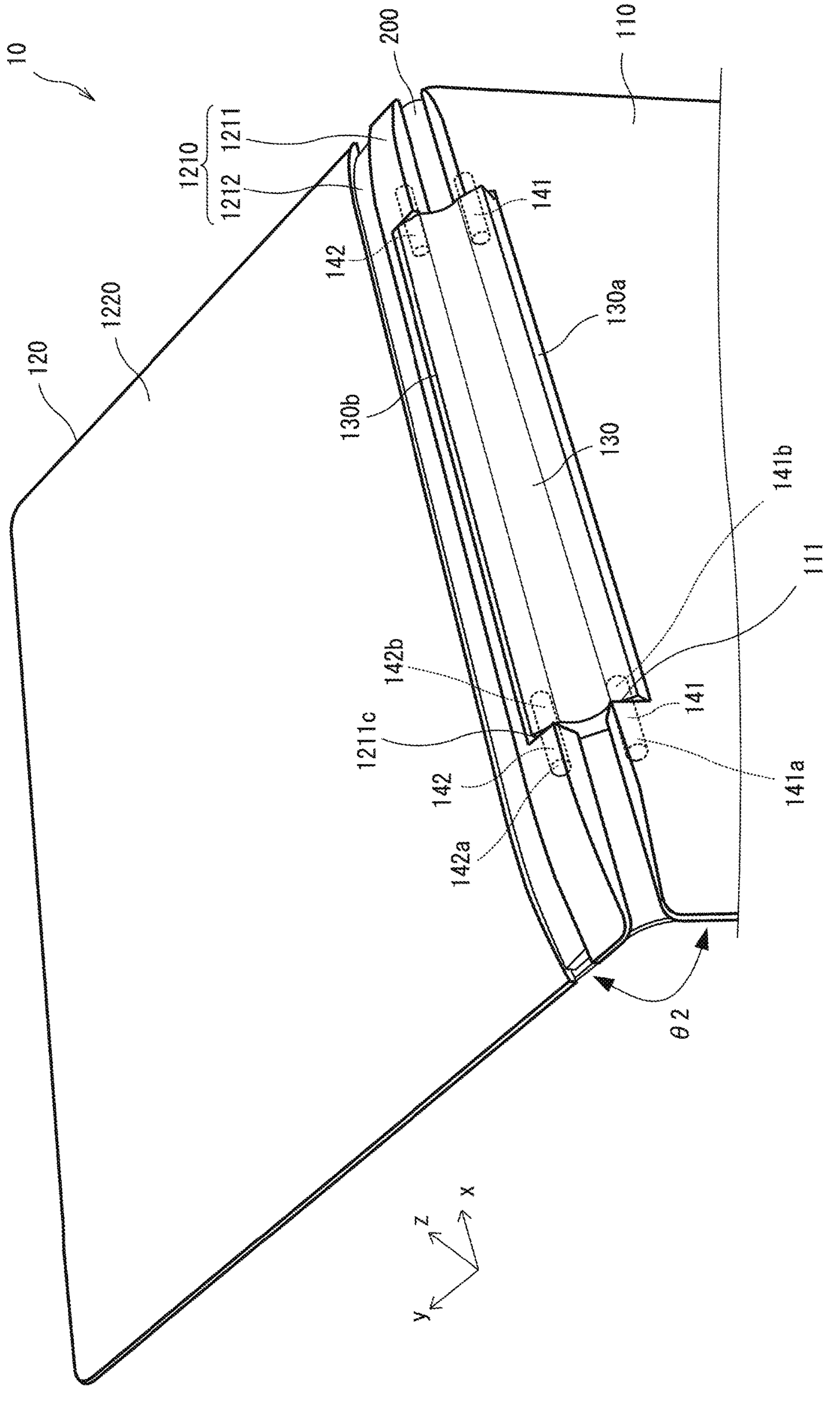
FIG. 5 is another perspective view of the display device in the opened state.
Figure 6:
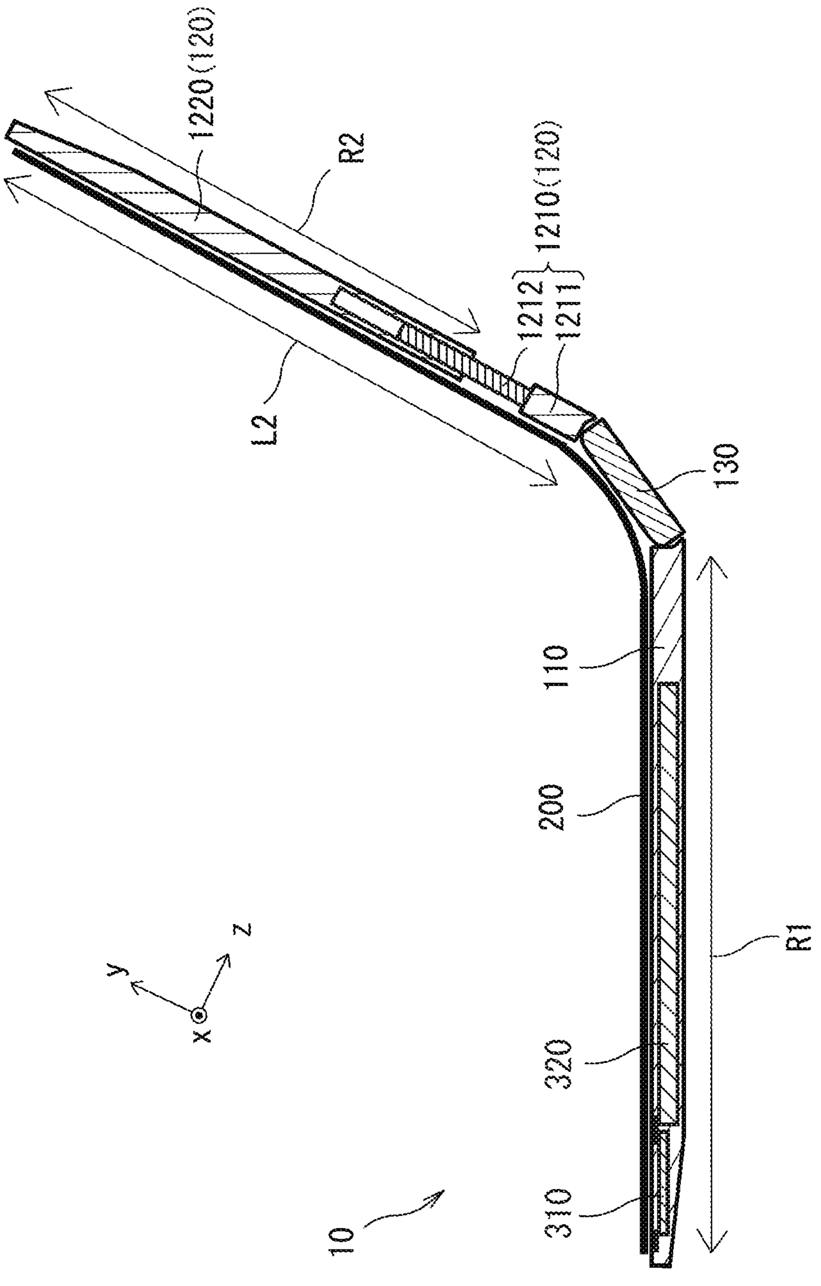
FIG. 6 is a sectional view taken along line VI-VI indicated in FIG. 4.
Figure 7:
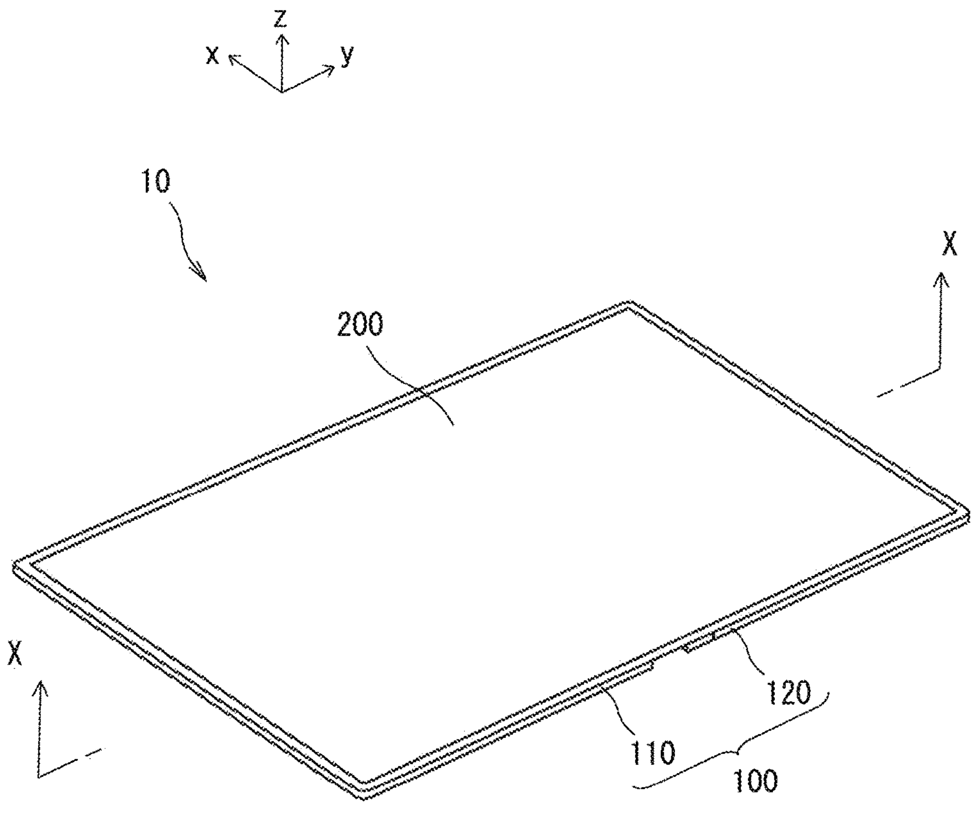
FIG. 7 is a perspective view of the display device in a fully opened state.
Figure 8:
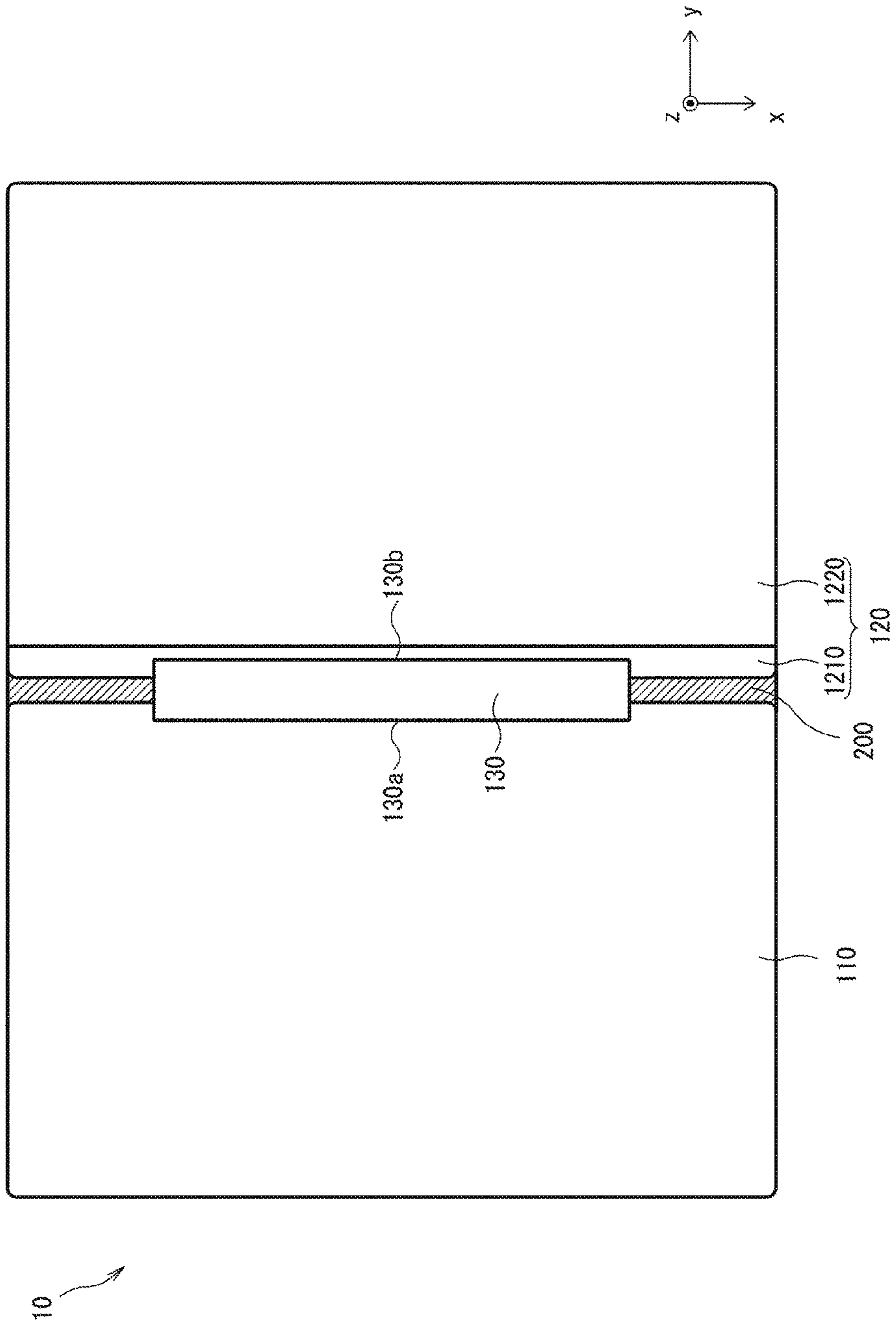
FIG. 8 is a plan view of the display device in the fully opened state.
Figure 9:
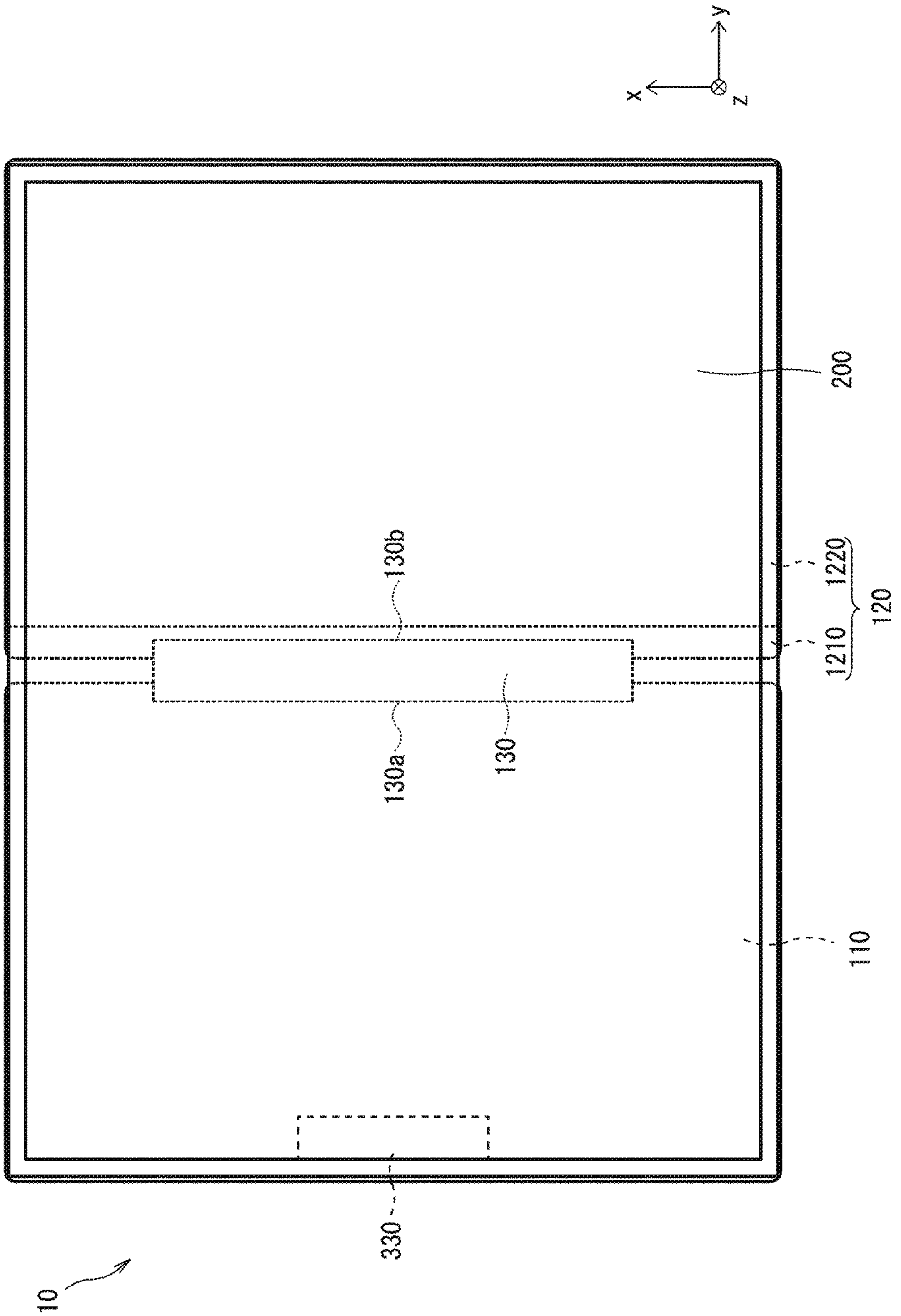
FIG. 9 is another plan view of the display device in the fully opened state.
Figure 10:
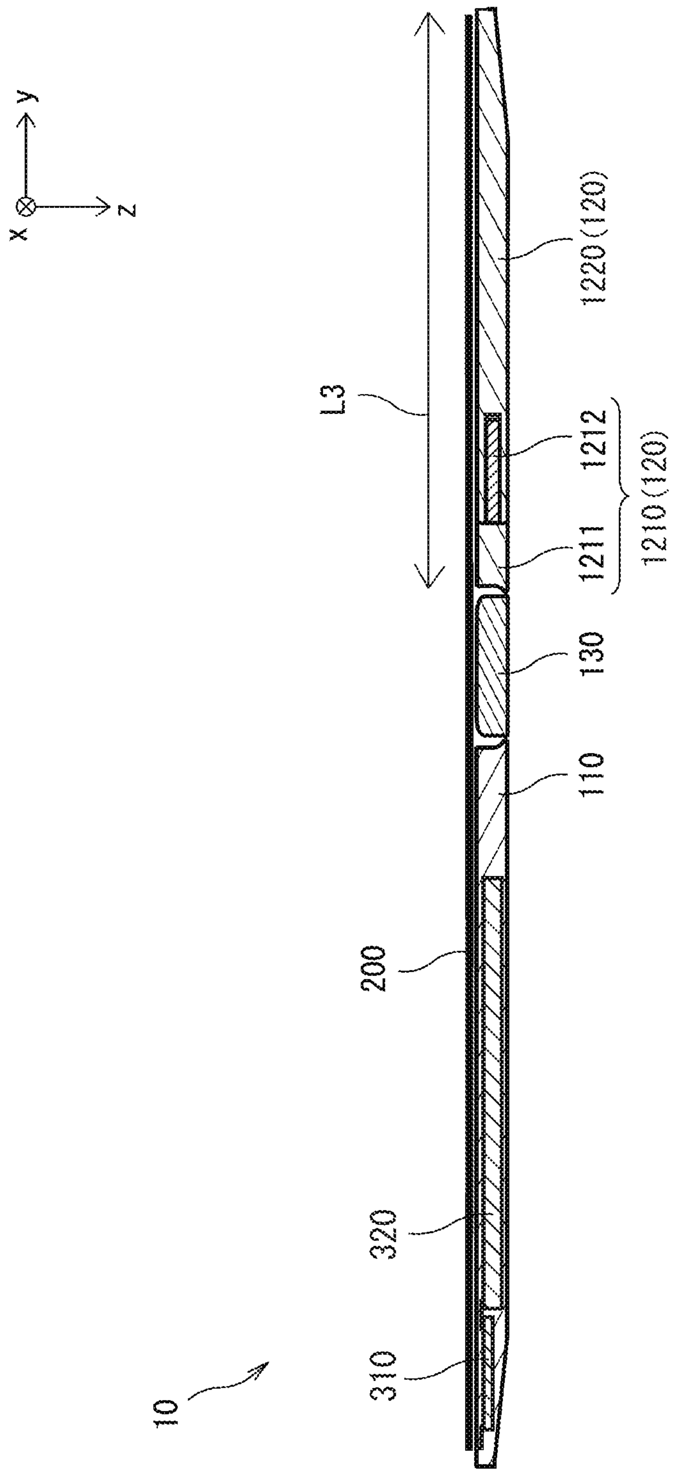
FIG. 10 is a sectional view taken along line X-X indicated in FIG. 7.

FIGS. 1 to 10 depicts a display device 10 according to the embodiment 1. The display device 10 includes a case unit 100 and a display panel 200. The case unit 100 is foldable to be deformed into a state where the case unit 100 is folded as in FIGS. 1 to 3, a state where the case unit 100 is opened as in FIGS. 4 to 6, and a state where the case unit 100 is fully opened as in FIGS. 7 to 10. FIGS. 1, 2, 4, 5, and 7 are perspective views of the display device 10. FIG. 3 is a sectional view taken along line indicated in FIG. 1. FIG. 6 is a sectional view taken along line VI-VI indicated in FIG. 4. FIGS. 8 and 9 are plan views of the display device 10. FIG. 10 is a sectional view taken along line X-X indicated in FIG. 7. The display device 10 depicted in FIG. 1 has dimensions about the A4 size or the like in the state where the case unit 100 is fully opened as in FIGS. 7 to 10.

(Case Unit)

The case unit 100 includes a lower case 110 (first support member), an upper case 120 (second support member), and a connecting plate 130. The lower case 110 is a tabular member having a substantially rectangular shape. The upper case 120 is a tabular member having a substantially rectangular shape. The connecting plate 130 is a plate member having an elongated rectangular shape. As depicted in FIGS. 2 and 5, the lower case 110 is coupled to a first long side 130*a* out of long sides of the connecting plate 130 via a first hinge part 141. The connecting plate 130 is thus turnable with respect to the lower case 110. The upper case 120 is coupled to a second long side 130*b* out of the long sides of the connecting plate 130 via a second hinge part 142. The upper case 120 is thus turnable with respect to the connecting plate 130. In these manners, the first hinge part 141 connects the lower case 110 and the connecting plate 130, and the second hinge part 142 connects the connecting plate 130 and the upper case 120.

In the following description, assume that the connecting plate 130 has a longitudinal direction referred to as an x direction, the upper case 120 is disposed in an xy plane, and the upper case 120 has a thickness direction referred to as a z direction.

The lower case 110 and the upper case 120 face each other in the closed state depicted in FIGS. 1 to 3. The connecting plate 130 stands in the thickness direction (substantially the z direction) of the lower case 110 and the upper case 120 to secure a distance between the lower case 110 and the upper case 120.

FIGS. 4 to 6 depict the opened display device 10 with the lower case 110 and the upper case 120 forming an angle of about 120 degrees (see an angle θ2 indicated in FIGS. 4 and 5). The display device 10 in this state can be used by a user as a notebook PC device with a keyboard (not depicted) displayed in a portion 200A in contact with the lower case 110, in the display panel 200.

The lower case 110, the connecting plate 130, and the upper case 120 are aligned flush with one another (in the xy plane) in the opened state depicted in FIGS. 7 to 10. A user can use the display device 10 in this state as a tablet terminal device.

(Lower Case)

Figure 11:
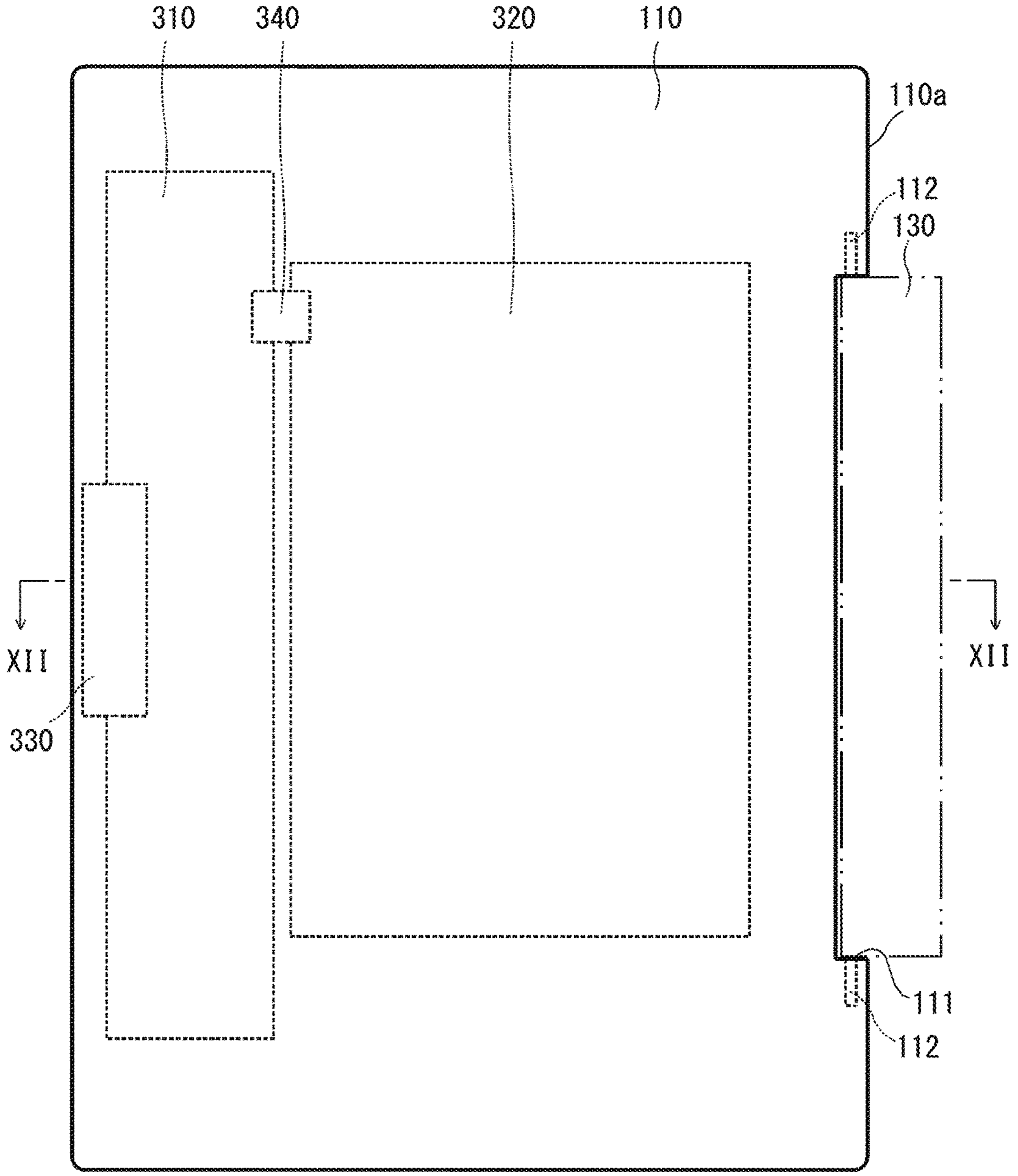
FIG. 11 is a plan view of a lower case.
Figure 12:
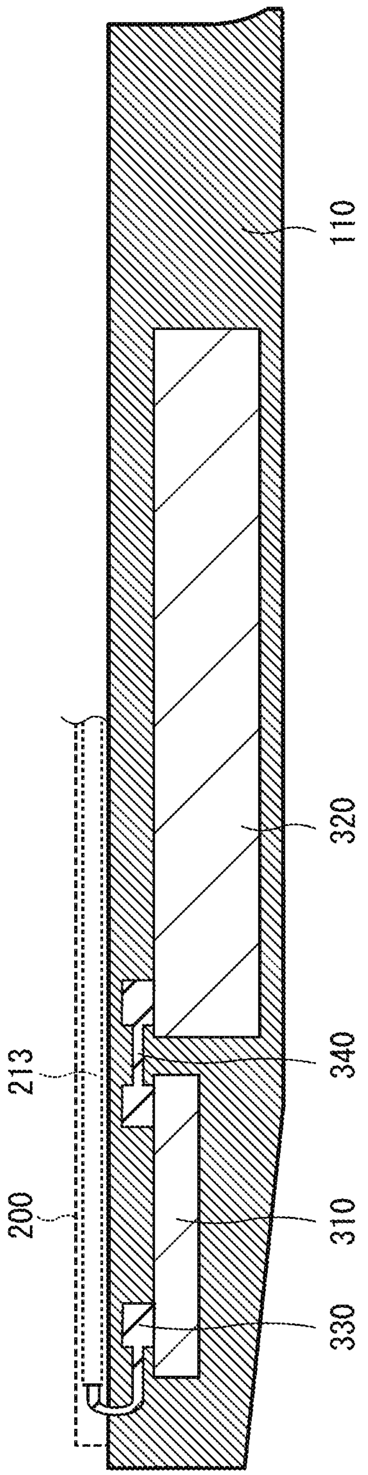
FIG. 12 is a sectional view taken along line XII-XII indicated in FIG. 11.

FIGS. 11 and 12 are a plan view and a sectional view of the lower case 110, respectively. As depicted in FIGS. 11 and 12, the lower case 110 accommodates a driving circuit board 310 and a battery 320. The driving circuit board 310 is electrically connected, via a flexible printed board 330, with a line layer 213 (see FIG. 25) provided in the display panel 200. The battery 320 is electrically connected with the driving circuit board 310 via the flexible printed board 340.

The lower case 110 has a side 110*a* adjacent to the connecting plate 130. The side 110*a* is provided with a U-shaped notch 111 to be coupled to the first long side 130*a* of the connecting plate 130. The notch 111 has a hole extending in the x direction to serve as a first hinge attachment 141*a* configured to receive the first hinge part 141.

(Upper Case)

Figure 13:
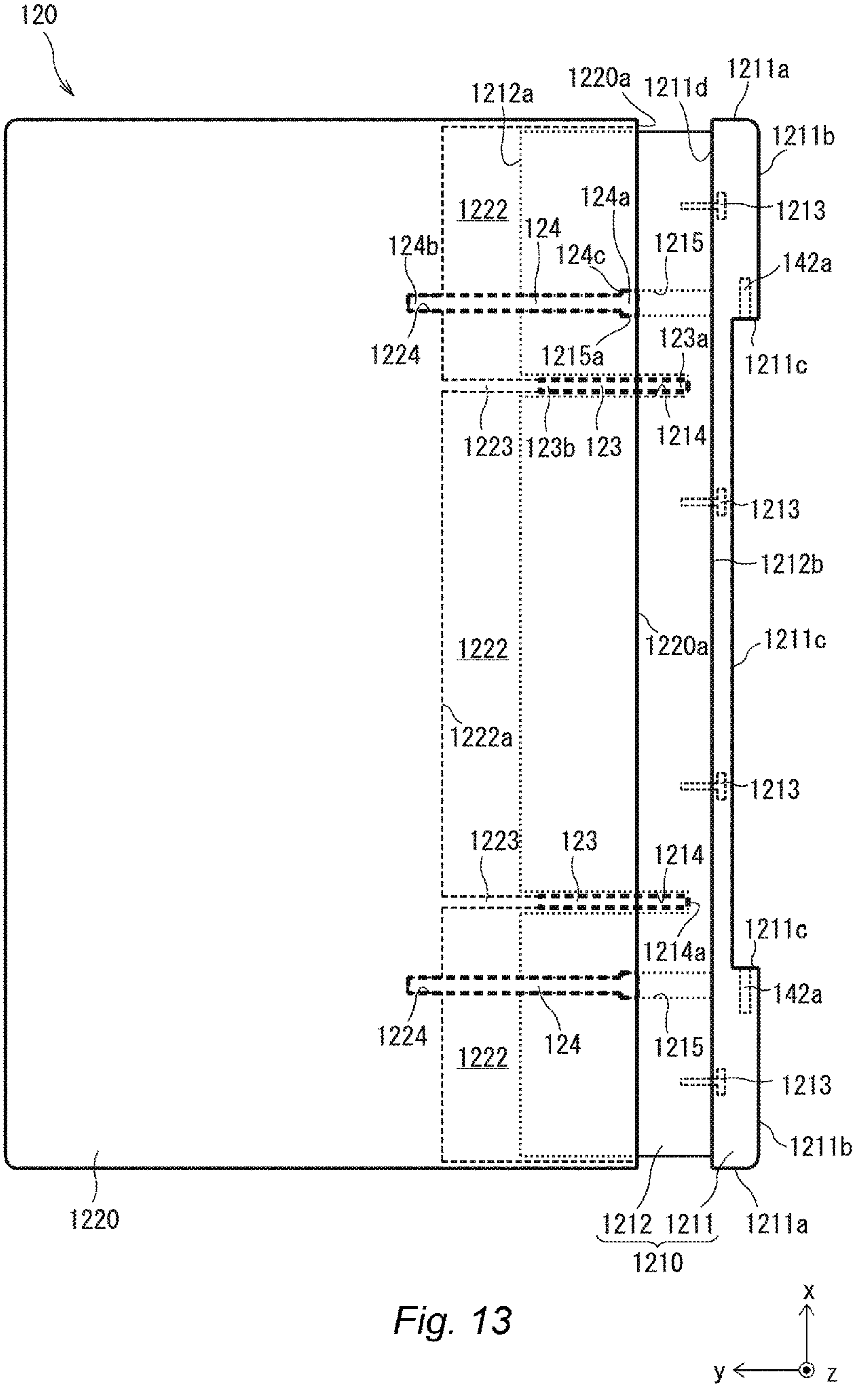
FIG. 13 is a plan view of an upper case having a maximum dimension in a y direction.

FIG. 13 is a plan view of the upper case 120. The upper case 120 includes a first member 1210 and a second member 1220. The first member 1210 and the second member 1220 each have a rectangular shape and a substantially uniform thickness. The first member 1210 and the second member 1220 are disposed in the xy plane. The first member 1210 is shiftable in a y direction relatively to the second member 1220. The upper case 120 is then varied in dimension in the y direction. The first member 1210 of the upper case 120 is coupled to the connecting plate 130. FIG. 13 depicts the upper case having a maximum dimension in the y direction.

(First Member)

Figure 14:
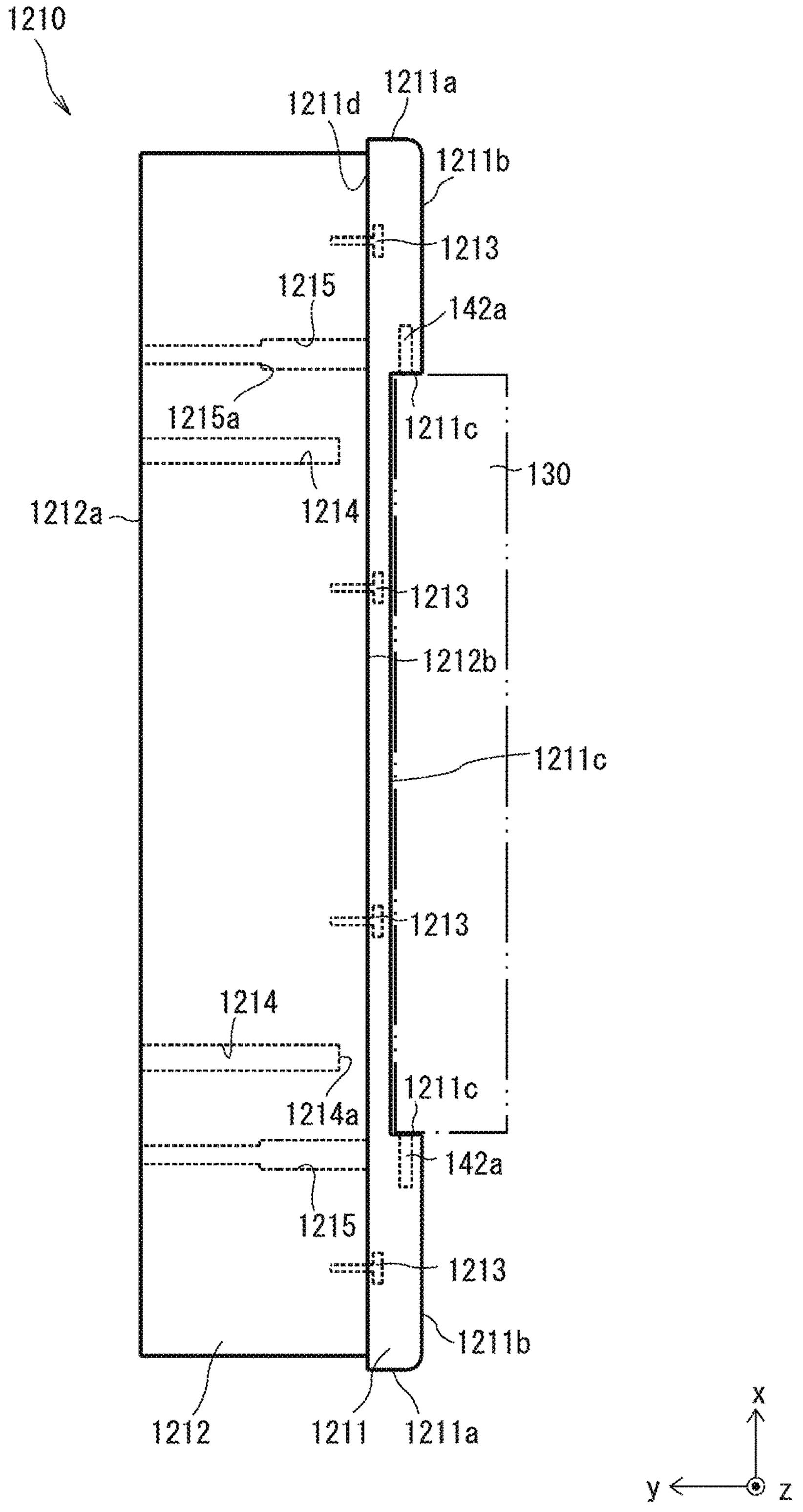
FIG. 14 is a plan view of a first member.

As depicted in FIG. 14, the first member 1210 includes a main portion 1211 and an extending portion 1212. The main portion 1211 and the extending portion 1212 are fixed to each other with screws 1213.

As depicted in FIG. 14, the entire main portion 1211 has an elongated rectangular tabular shape with a thickness in the z direction. The main portion 1211 is equal in dimension in the x direction to the first member 1210. The main portion 1211 is equal in dimension (thickness) in the z direction to the upper case 120. The main portion 1211 viewed on the xy plane has a surface 1211*a* including a side in the y direction and expanding along a yz plane of the upper case 120. The main portion 1211 viewed on the xy plane has a surface 1211*b* including a side coupled to the connecting plate 130, out of sides extending in the x direction. The surface 1211*b* is provided with a U-shaped notch 1211*c*. The notch 1211*c* has a hole extending in the x direction to serve as a second hinge attachment 142*a* configured to receive the second hinge part 142.

As depicted in FIG. 14, the extending portion 1212 projects from a surface 1211*d* adjacent to the second member 1220, of the main portion 1211. The extending portion 1212 has a rectangular shape with a substantially uniform thickness in the z direction. The extending portion 1212 is shaped to be inserted to a first member accommodating portion 1222 of the second member 1220 to be described later.

The extending portion 1212 is provided with a spring attachment hole 1214. The spring attachment hole 1214 extends from an end surface 1212*a* adjacent to the second member 1220, of the extending portion 1212 toward the main portion 1211. The spring attachment hole 1214 has a pillar shape with a circular cross section so as to receive a spring 123 to be described later. The spring attachment hole 1214 has a bottom 1214*a* fixing a first end 123*a* of the spring 123 (see FIG. 13). There can be provided two to four spring attachment holes 1214.

The extending portion 1212 is provided with a shaft hole 1215. The shaft hole 1215 penetrates from the end surface 1212*a* adjacent to the second member 1220, of the extending portion 1212 to an end surface 1212*b* adjacent to the main portion 1211. The shaft hole 1215 has a pillar shape with a circular cross section so as to receive a first end 124*a* of a shaft 124 to be described later. The shaft hole 1215 has an inner wall surface provided with a step 1215*a* at a halfway position between the end surface 1212*a* adjacent to the second member 1220 and the end surface 1212*b* adjacent to the main portion 1211. The shaft hole 1215 in the end surface 1212*b* of the extending portion 1212 is thus larger in diameter than the shaft hole 1215 in the end surface 1212*a*. There can be provided two to four shaft holes 1215.

(Second Member)

Figure 15:
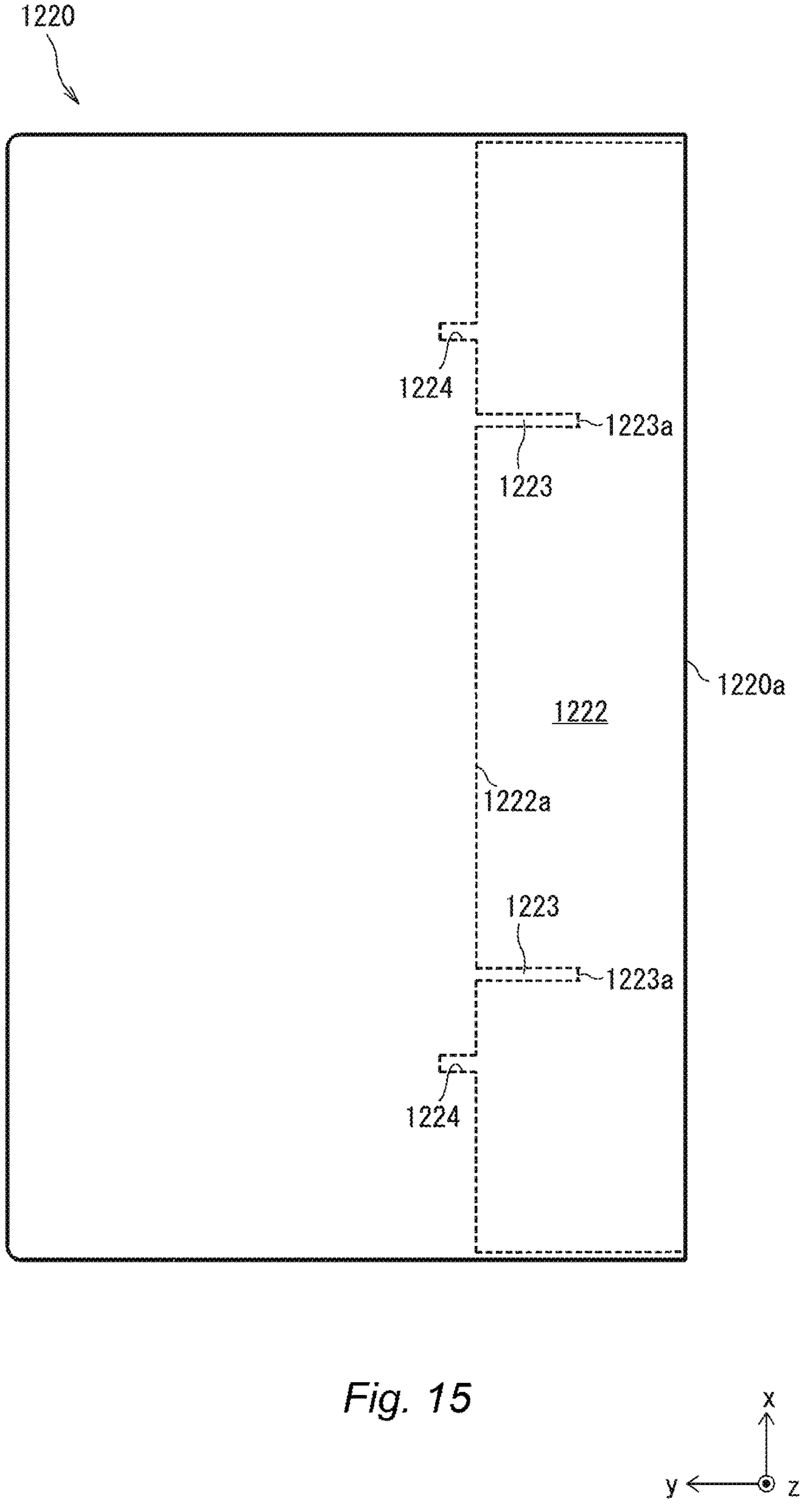
FIG. 15 is a plan view of a second member.

As depicted in FIG. 15, the second member 1220 is provided therein with the first member accommodating portion 1222 serving as a space accommodating the extending portion 1212 of the first member 1210. The entire first member accommodating portion 1222 has a rectangular tabular shape.

At an end surface 1220*a* of the second member 1220, the first member accommodating portion 1222 has a dimension (width) in the x direction not less than a dimension of the extending portion 1212 in the x direction. The first member accommodating portion 1222 has a dimension (depth) in the y direction not less than a dimension of the extending portion 1212 in the y direction. The first member accommodating portion 1222 can thus accommodate the extending portion 1212 of the first member 1210. The first member 1210 has a portion that is accommodated in the first member accommodating portion 1222 and varies in dimension (depth) in the y direction, so that the entire upper case 120 is varied in dimension in the y direction.

The first member accommodating portion 1222 has inner walls including a surface 1222*a* that is most distant from the end surface 1220*a* of the second member 1220 and is provided with a spring attachment 1223. The spring attachment 1223 has a pillar shape projecting from the inner wall surface 1222*a* of the first member accommodating portion 1222 toward the first member 1210. The spring attachment 1223 has a distal end 1223*a* fixing a second end 123*b* of the spring 123 to be described later (see FIG. 13). The inner wall surface 1222*a* of the first member accommodating portion 1222 can be provided with two to four spring attachments 1223. The spring attachments 1223 are provided correspondingly to the spring attachment holes 1214 of the first member 1210.

The inner wall surface 1222*a* of the first member accommodating portion 1222 is provided with a shaft attachment 1224. The shaft attachment 1224 is provided at the inner wall surface 1222*a* of the first member accommodating portion 1222. The shaft attachment 1224 is configured by a recess in the inner wall surface 1222*a* of the first member accommodating portion 1222. The shaft attachment 1224 accommodates a second end 124*b* of the shaft 124 to be described later, and fixes the second end 124*b* of the shaft 124. The recess serving as the shaft attachment 1224 can have an inner diameter substantially equal to an outer shape of the second end 124*b* of the shaft 124 and be engaged therewith to fix the shaft 124. Alternatively, the second end 124*b* of the shaft 124 and the shaft attachment 1224 can be bonded to each other with a bonding member or the like. The inner wall surface 1222*a* of the first member accommodating portion 1222 can be provided with two to four shaft attachments 1224. The shaft attachments 1224 are provided correspondingly to the shaft holes 1215 of the first member 1210.

Figure 16:
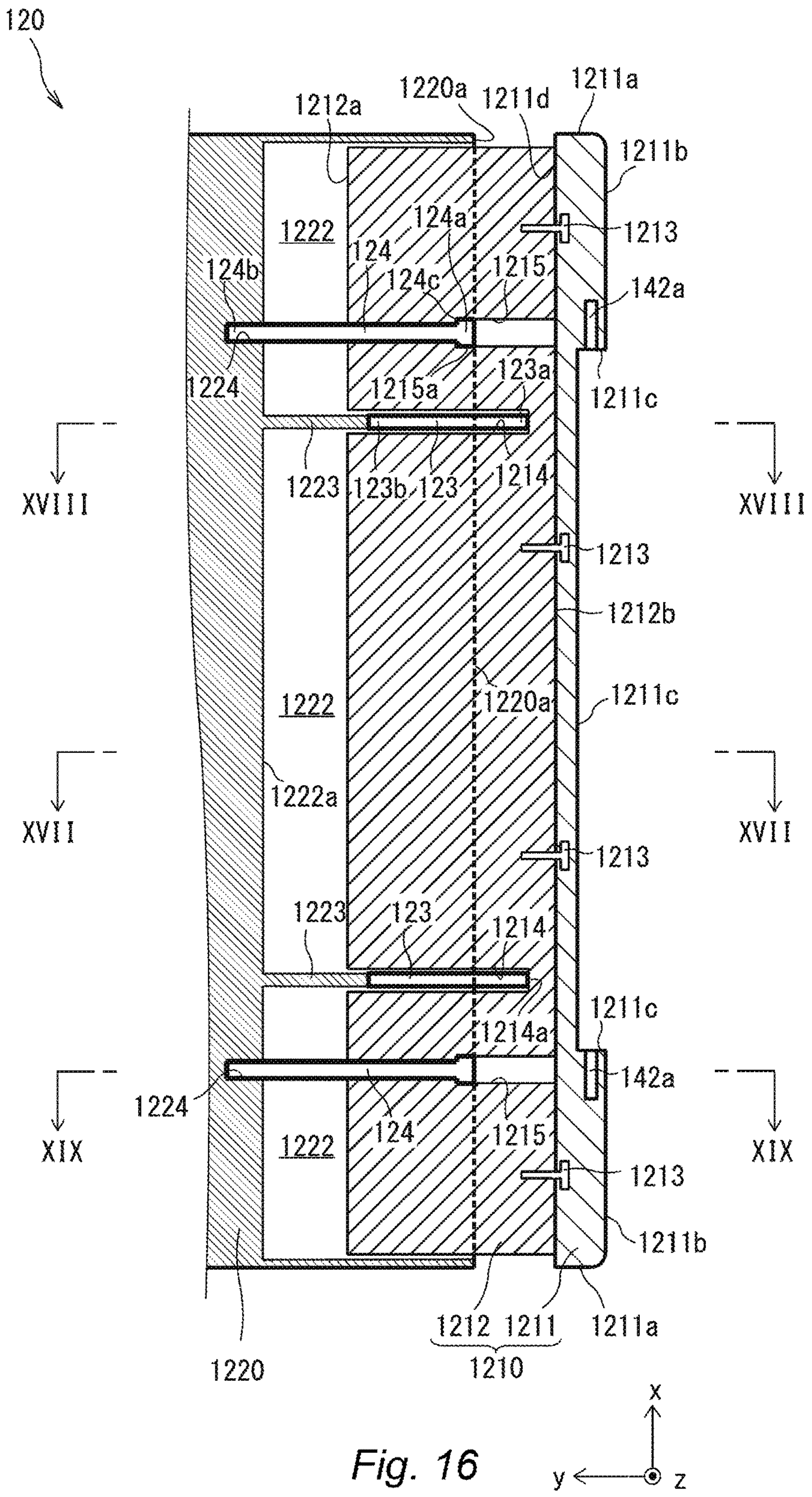
FIG. 16 is a sectional view in a xy plane direction, of the upper case depicted in FIG. 13.
Figure 17:
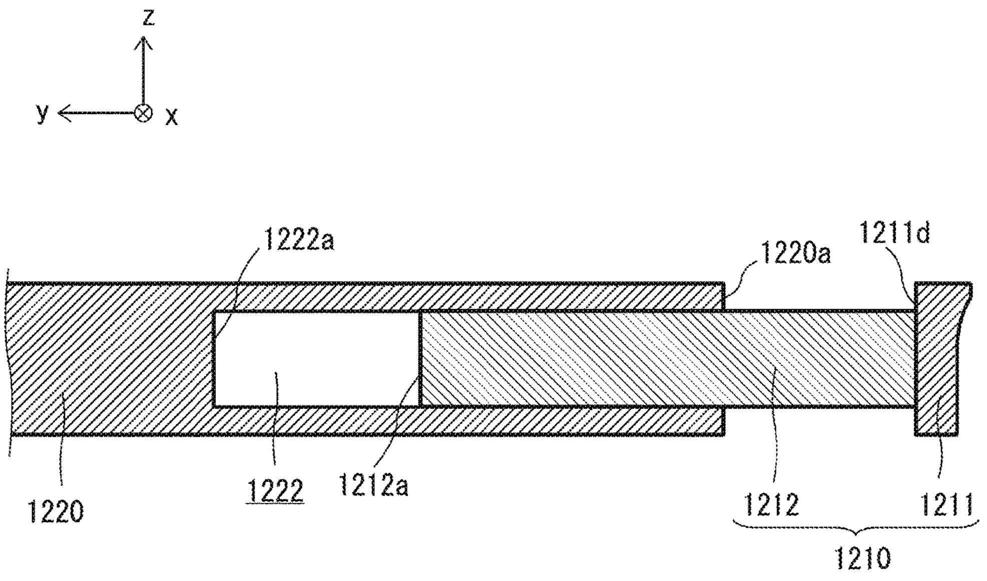
FIG. 17 is a sectional view taken along line XVII-XVII indicated in FIG. 16.
Figure 18:
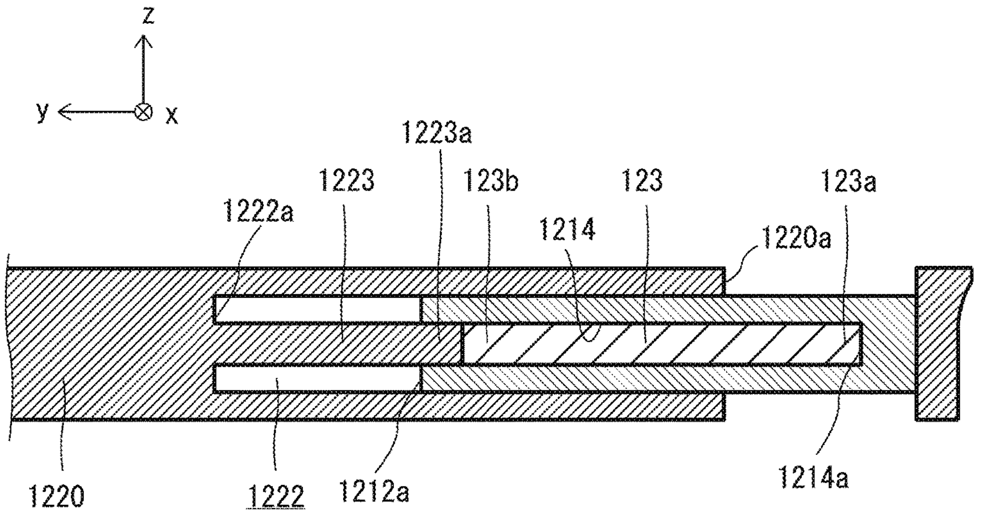
FIG. 18 is a sectional view taken along line XVIII-XVIII indicated in FIG. 16.
Figure 19:
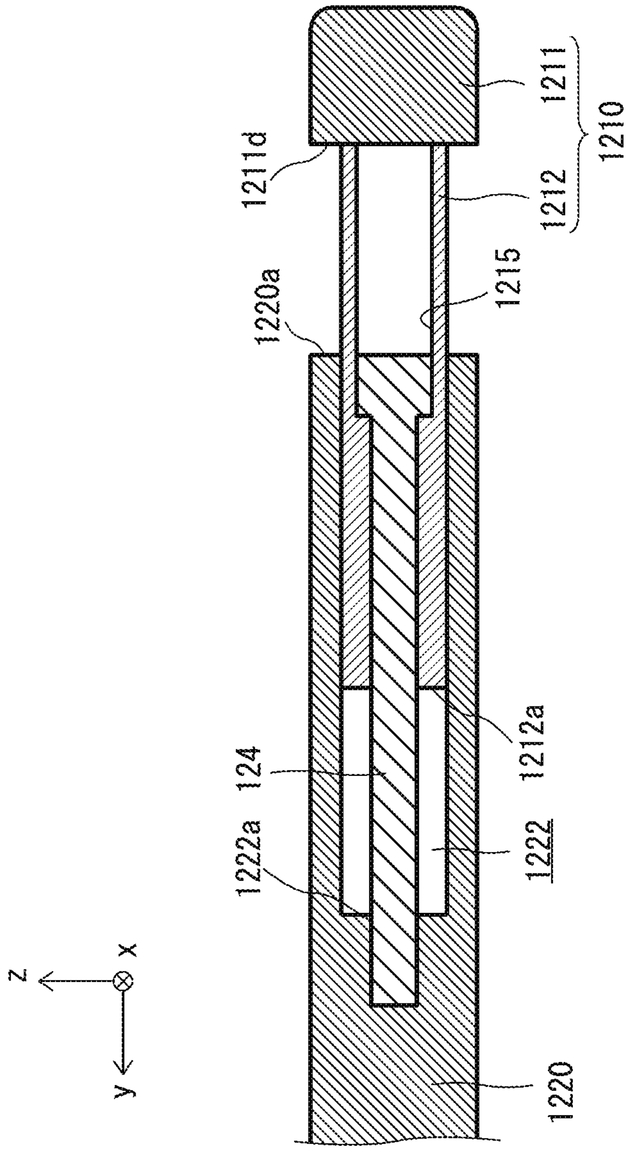
FIG. 19 is a sectional view taken along line XIX-XIX indicated in FIG. 16.
Figure 20:
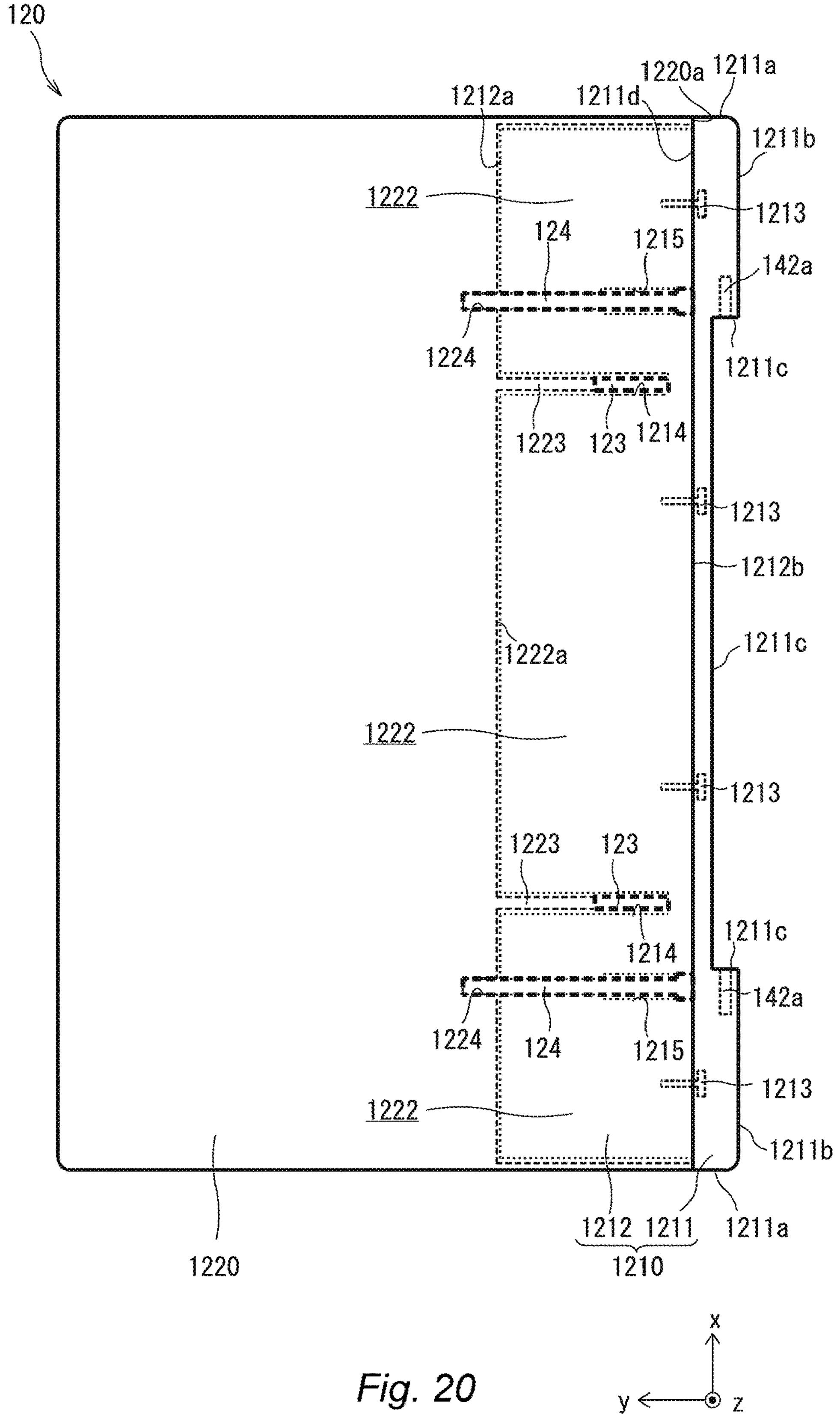
FIG. 20 is a plan view of the upper case having a minimum dimension in the y direction.
Figure 21:
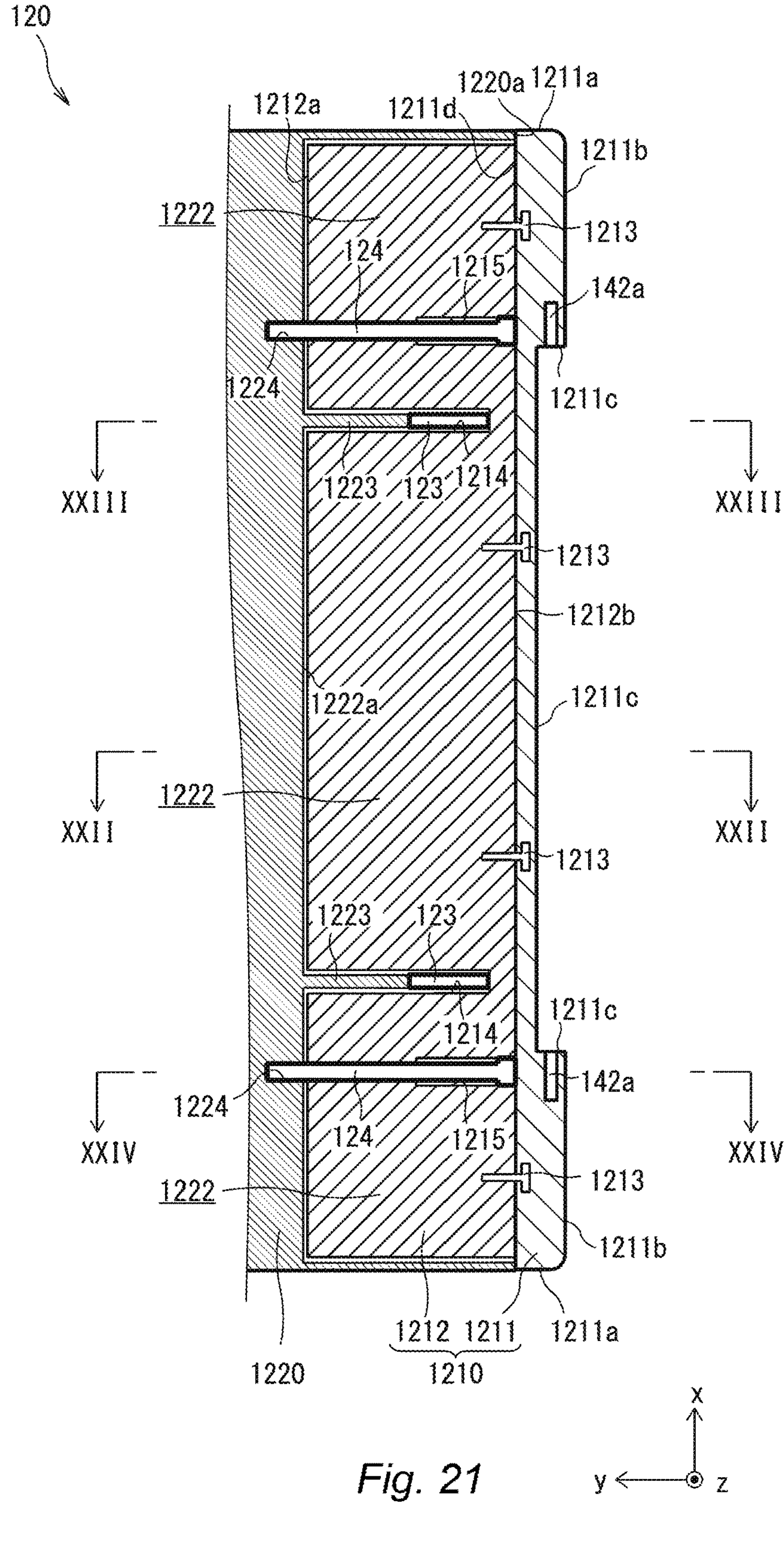
FIG. 21 is a sectional view in the xy plane direction, of the upper case depicted in FIG. 20.
Figure 22:
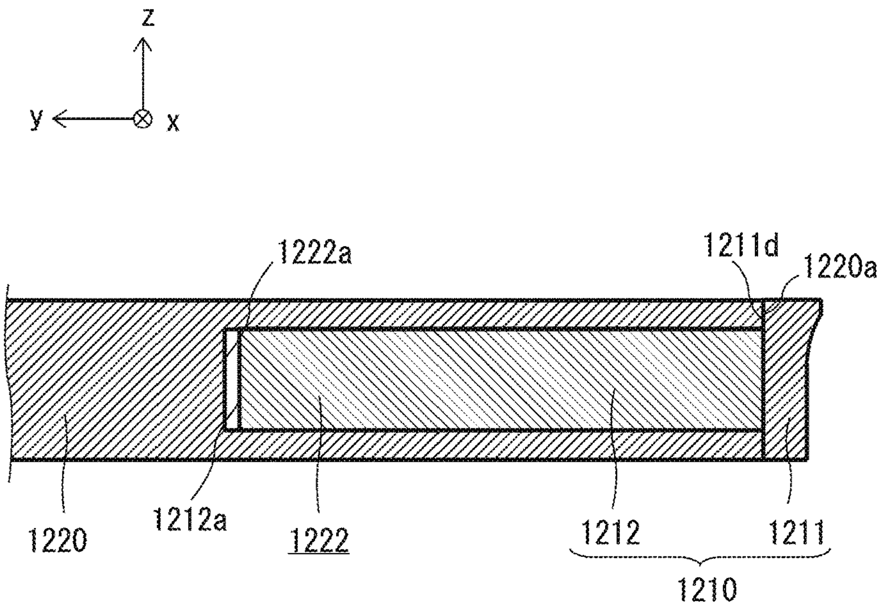
FIG. 22 is a sectional view taken along line XXII-XXII indicated in FIG. 21.
Figure 23:
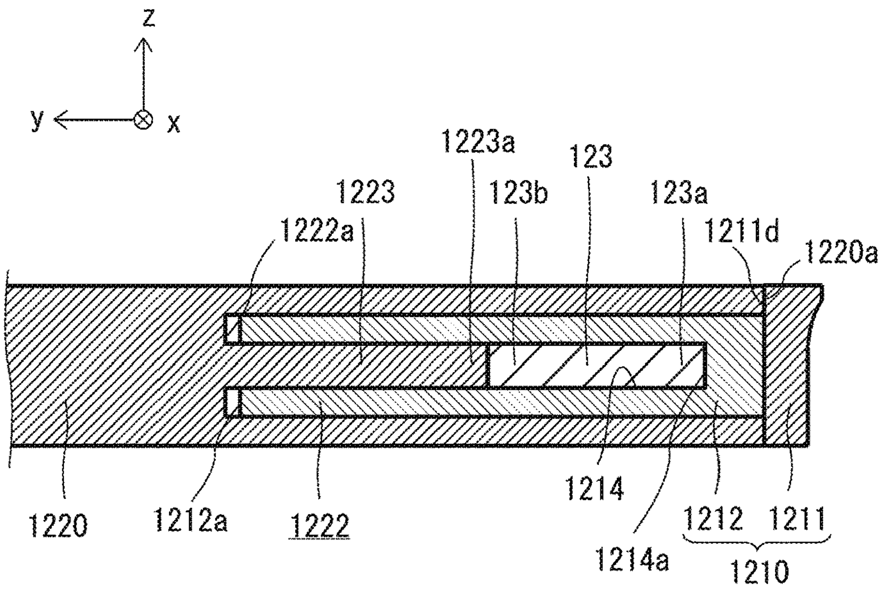
FIG. 23 is a sectional view taken along line XXIII-XXIII indicated in FIG. 21.
Figure 24:
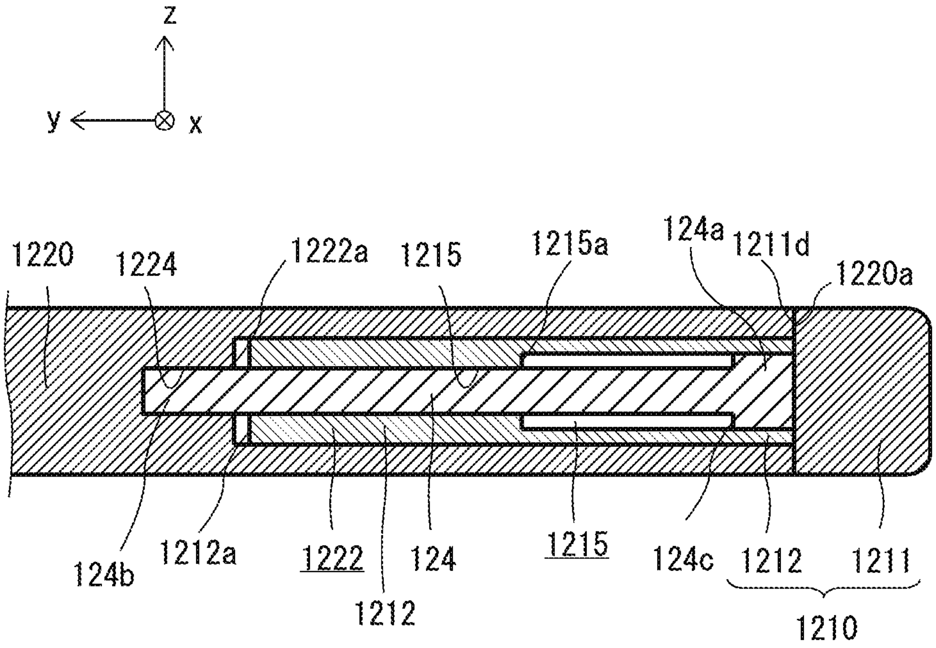
FIG. 24 is a sectional view taken along line XXIV-XXIV indicated in FIG. 21.

The upper case 120 will be described next in terms of its entire structure with reference to FIGS. 13 and 16 to 24. FIG. 16 is a sectional view in an xy plane direction, of the upper case 120 depicted in FIG. 13. FIG. 17 is a sectional view in a yz plane direction, of the lower case 110 taken along line XVII-XVII indicated in FIG. 16. FIG. 18 is a sectional view in the yz plane direction, of the lower case 110 taken along line XVIII-XVIII indicated in FIG. 16. FIG. 19 is a sectional view in the yz plane direction, of the lower case 110 taken along line XIX-XIX indicated in FIG. 16. FIG. 20 is a plan view of the upper case 120 having a minimum dimension in the y direction. FIG. 21 is a sectional view in the xy plane direction, of the upper case 120 depicted in FIG. 20. FIG. 22 is a sectional view in the yz plane direction, of the lower case 110 taken along line XXII-XXII indicated in FIG. 21. FIG. 23 is a sectional view in the yz plane direction, of the lower case 110 taken along line XXIII-XXIII indicated in FIG. 21. FIG. 24 is a sectional view in the yz plane direction, of the lower case 110 taken along line XXIV-XXIV indicated in FIG. 21.

As depicted in FIG. 13, the first end 123*a* of the spring 123 is inserted to the spring attachment hole 1214 of the first member 1210 and is fixed to the bottom 1214*a* of the spring attachment hole 1214. The second end 123*b* of the spring 123 is fixed to the spring attachment 1223 of the second member 1220.

As depicted in FIG. 13, the first end 124*a* of the shaft 124 is inserted to the shaft hole 1215 of the first member 1210. The second end 124*b* of the shaft 124 is fixed to the shaft attachment 1224 of the second member 1220. The first member 1210 and the second member 1220 thus have a relative shift direction restrained to the y direction.

The shaft 124 has a side surface provided with a step 124*c* at a position between the center in the y direction and the first end 124*a*. The first end 124*a* of the shaft 124 is thus larger in diameter than the second end 124*b* of the shaft 124. The step 124*c* on the side surface of the shaft 124 is positioned to engage with the step 1215*a* provided at the shaft hole 1215. The shaft 124 is thus not disengaged from the shaft hole 1215 (see FIGS. 13, 16, and 19), to limit a relative shift distance between the first member 1210 and the second member 1220.

As depicted in FIGS. 13, 16, and 18, when external force is applied to separate the first member 1210 and the second member 1220 from each other, the spring 123 is expanded to separate the first member 1210 and the second member 1220 from each other (see particularly FIG. 18). The expanded spring 123 has a maximum dimension when the step 1215*a* of the shaft hole 1215 is in contact with the step 124*c* of the shaft 124.

As depicted in FIGS. 20, 21, and 23, when no external force is applied to separate the first member 1210 and the second member 1220 from each other in the y direction, the end surface 1211*d* of the main portion 1211 of the first member 1210 is in contact with the end surface 1220*a* of the second member 1220 to minimize the dimension in the y direction of the upper case 120 (see particularly FIG. 23). The spring 123 preferably has a natural length when the upper case 120 has the minimum dimension in the y direction.

As depicted in FIGS. 1, 2, and 5, each of the lower case 110 and the upper case 120 can be designed to be gradually thinned toward the peripheral edge of the case, or can be designed to be uniform in thickness at the center and the peripheral edge of the case.

The lower case 110 and the upper case 120 facing each other have a contact portion therebetween (a peripheral edge portion of an area having the display panel 200 attached thereto), which is optionally provided with a buffer (not depicted). The buffer restrains damage to the lower case 110 or the upper case 120 facing each other (in the closed display device 10).

(Connecting Plate)

As depicted in FIGS. 2 and 5, the connecting plate 130 has a rectangular tabular shape elongated in the x direction, with a predetermined width in the y direction and a thickness in the z direction.

As depicted in FIGS. 2 and 5, the connecting plate 130 has side surfaces in the yz plane direction respectively provided with a first hinge attachment 141*b* and a second hinge attachment 142*b*. The first hinge attachment 141*b* is provided correspondingly to the first hinge attachment 141*a* of the lower case 110.

The second hinge attachment 142*b* is provided correspondingly to the second hinge attachment 142*a* of the upper case 120. The lower case 110 and the connecting plate 130 are coupled to each other via the first hinge part 141 inserted to the first hinge attachments 141*a* and 141*b* provided at the lower case 110 and the connecting plate 130, respectively. The lower case 110 and the connecting plate 130 are relatively turnable about an axis in the x direction. The upper case 120 and the connecting plate 130 are coupled to each other via the second hinge part 142 inserted to the second hinge attachments 142*a* and 142*b* provided at the upper case 120 and the connecting plate 130, respectively. The upper case 120 and the connecting plate 130 are relatively turnable about an axis in the x direction.

The first hinge part 141 and the second hinge part 142 can be each configured by a hinge having a damper structure and typically applied to a notebook PC and the like. Such hinges retain the lower case 110 and the upper case 120 forming an appropriate open angle (the angle θ2 indicated in FIG. 5).

(Display Panel)

The display panel 200 has flexibility. The display panel 200 is exemplified by a flexible organic EL display panel including a touch panel layer.

Figure 25:
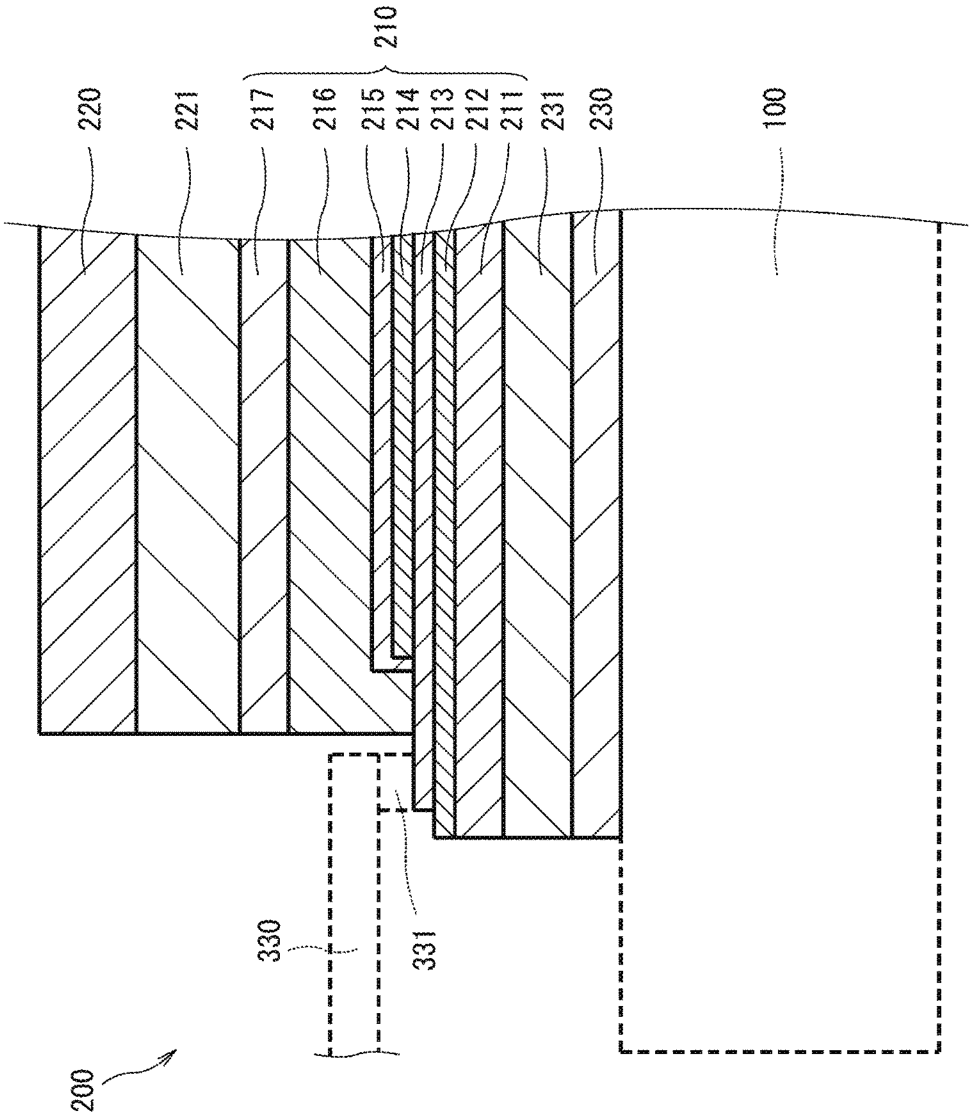
FIG. 25 is a sectional view of a display panel.

FIG. 25 is a sectional view of the display panel 200. The display panel 200 includes a flexible organic EL display panel 210, a functional film 220 provided on a display surface to be viewed of the flexible organic EL display panel 210, and a support film 230 provided on a surface opposite to the display surface to be viewed of the flexible organic EL display panel 210.

The organic EL display panel 210 includes a film substrate 211, a passivation film 212, the line layer 213, an EL layer 214, a sealing film 215, an adhesion layer 216, and an opposing film 217. The line layer 213 includes lines, TFTs in pixels, and TFTs in a terminal area. The EL layer 214 includes stacked organic films such as a hole transport layer, a luminous layer, and an electron transport layer.

The functional film 220 is bonded to a surface of the opposing film 217 of the organic EL display panel 210 with an adhesive agent 221. The functional film 220 typically includes the touch panel layer. The functional film 220 is preferred to further include a surface protective layer or the like.

The support film 230 is bonded to a surface of the film substrate 211 of the organic EL display panel 210 with an adhesive agent 231.

The line layer 213 is partially uncovered with the adhesion layer 216 in the terminal area of the organic EL display panel 210. The portion of the line layer 213 uncovered with the adhesion layer 216 is electrically connected with the flexible printed board (FPC) 330 via an anisotropic conductive film (ACF) 331.

The display panel 200 is bonded to the case unit 100 with a bonding member (not depicted). The display panel 200 is fixed to the case unit 100 at the lower case 110 (see an area R1 in FIG. 6) and the second member 1220 (see an area R2 in FIG. 6). Examples of the bonding member include an adhesive agent and a double sided tape.

(Display Device in Closed State)

The opened and closed states of the display device 10 will be described in more detail below with reference to FIGS. 1 to 10 again. FIGS. 1 to 3 depict the closed display device 10. The lower case 110 and the upper case 120 face each other in the case unit 100 in this state. The lower case 110 and the upper case 120 form an angle θ1 (see FIG. 3) of about one to ten degrees. The connecting plate 130 is positioned along a plane slightly slanted from an xz plane. The display panel 200 is folded and accommodated in a space configured by the lower case 110, the upper case 120, and the connecting plate 130. In the case where the buffer is provided at the contact portion (the peripheral edge portion of the area having the display panel 200 attached thereto) between the lower case 110 and the upper case 120 facing each other and the buffer has a large thickness, the angle θ1 between the lower case 110 and the upper case 120 possibly has zero degrees.

The upper case 120 in the closed display device 10 depicted in FIG. 3 has a maximum dimension L1 in the y direction. Details of the structure of the upper case 120 having the maximum dimension in the y direction have been described earlier with reference to FIGS. 13 and 16 to 19.

The connecting plate 130 stands on the lower case 110 and the upper case 120 in the case unit 100. The lower case 110, the upper case 120, and the connecting plate 130 thus form a substantially triangular space A in a cross section along the yz plane. The display panel 200 is folded to be halved in dimensions with a bent portion curved to have a radius of curvature of about one to ten. The display panel 200 is thus restrained from being damaged even in the folded display device 10.

(Display Device in Opened State 1)

Described next is the state where the lower case 110 and the upper case 120 in the display device 10 are opened to form the predetermined angle θ2. FIGS. 4 to 6 depict the state where the lower case 110 and the upper case 120 in the display device 10 are opened. The angle between the lower case 110 and the upper case 120 can appropriately be determined by a user. The first hinge part 141 and the second hinge part 142 are each configured by a hinge having the damper structure. The angle θ2 between the lower case 110 and the upper case 120 can thus be kept as appropriately determined by a user. For example, the display device 10 can be used by a user as a notebook PC device with a keyboard displayed on the display panel 200 in the lower case 110.

In this case, the display panel 200 has a larger curvature at the bent portion than that in the closed display device 10. The upper case 120 thus has a dimension L2 (see FIG. 6) in the y direction smaller than the dimension L1 in the closed display device 10. The dimension L2 in the y direction of the upper case 120 is adjusted to an optimal value with elastic force of the spring 123.

The display panel 200 is bonded to neither the first member 1210 of the upper case 120 nor the connecting plate 130, to be restrained from wrinkling at the bent portion thereof.

(Display Device in Opened State 2)

Described next is the state where the display device 10 is fully opened as depicted in FIGS. 7 to 10. The lower case 110, the upper case 120, and the connecting plate 130 in the case unit 100 in this state are all positioned on the xy plane. The display panel 200 is also positioned on the xy plane.

The upper case 120 in the fully opened display device 10 has a minimum dimension L3 (see FIG. 10) in the y direction. Details of the structure of the upper case 120 having the minimum dimension L3 in the y direction have been described earlier with reference to FIGS. 20 to 24.

The display panel 200 expands in the xy plane in this state. A user can then use the display device 10 as a tablet terminal device.

Modification Examples

The present embodiment exemplifies the case where the flexible organic EL display panel is adopted as the display panel 200. The present invention is, however, not particularly limited to this case. Examples of the display panel 200 include a liquid crystal display panel provided with a film substrate, and electronic paper. The electronic paper can be of an electrophoretic type, a quick-response liquid powder type, a microcapsule type, or the like.

In a case where the display panel 200 is configured by the organic EL display panel, the electronic paper, or the like, which is easily bendable, the folded display panel 200 has a small curvature. In another case where the display panel 200 is configured by a flexible liquid crystal display panel or the like, which is not easily bendable, the folded display panel 200 needs to secure a large curvature and the adopted connecting plate 130 thus has a large width (dimension in the y direction in the fully opened display panel 200).

The extending portion 1212 of the first member 1210 according to the present embodiment is provided with the spring attachment hole 1214 extending from the end surface 1212*a* adjacent to the second member 1220, of the extending portion 1212 toward the main portion 1211. For example, the spring attachment hole 1214 can alternatively penetrate from the end surface 1212*a* to the end surface 1212*b* facing the main portion 1211. In this case, the first end 123*a* of the spring 123 inserted to the spring attachment hole 1214 is fixed to the end surface 1211*d* of the main portion 1211, for example.

The shaft 124 according to the present embodiment restrains the direction and the distance of relative shift between the first member 1210 and the second member 1220. The direction and the distance of relative shift between the first member 1210 and the second member 1220 can alternatively be restrained by a measure other than the shaft. For example, there can be provided a groove in a first one of the extending portion 1212 of the first member 1210 and the inner wall surface of the first member accommodating portion 1222 of the second member 1220, and a projection engaged with the groove at a second one thereof, to restrain the direction and the distance of relative shift between the first member 1210 and the second member 1220.

The inner wall surface 1222*a* of the first member accommodating portion 1222 is provided with the shaft attachment 1224 in the present embodiment. The shaft attachment 1224 is not an essential element in the present invention. The shaft 124 can alternatively be bonded directly to the inner wall surface 1222*a*. The shaft attachment 1224 is, however, preferably provided in order to reliably fix the shaft 124.

The upper case 120 according to the present embodiment includes the first member 1210 and the second member 1220 to have the variable dimension in the y direction. The lower case 110, in place of the upper case 120, can alternatively have a variable lateral length (the dimension in the y direction of the fully opened display panel 200). The upper case secures a space accommodating the battery in this case. The upper case preferably has the variable dimension in the y direction as in the present embodiment in terms of stability of the display panel 200 due to the battery having heavy weight.

Figure 26:
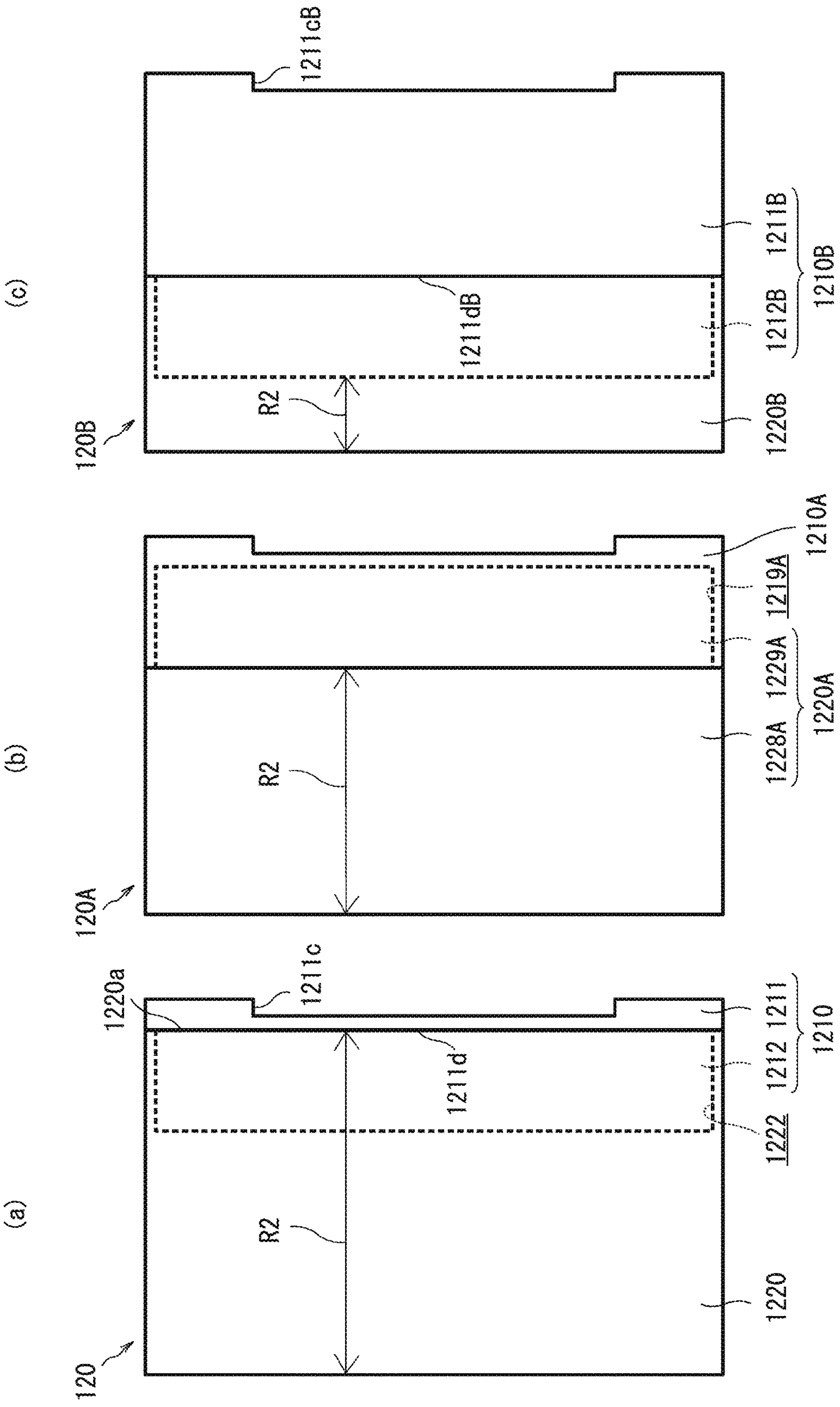
FIG. 26(*a*) is a schematic plan view of the upper case according to the present embodiment, and FIGS. 26(*b*) and 26(*c*) are schematic plan views of upper cases according to modification examples.

As depicted in FIG. 26(*a*), in the upper case 120 according to the present embodiment, the first member 1210 coupled to the connecting plate 130 includes the extending portion 1212 and the second member 1220 includes the first member accommodating portion 1222. The present invention is, however, not particularly limited to this case. As exemplified in FIG. 26(*b*), an upper case 120A can include a first member 1210A and a second member 1220A. The second member 1220A depicted in FIG. 26(*b*) includes a main portion 1228A and an extending portion 1229A. The first member 1210A has a second member accommodating portion 1219A.

As depicted in FIG. 26(*a*), the present embodiment further exemplifies that the end surface 1211*d* of the main portion 1211 and the end surface 1220*a* of the second member 1220 are in contact with each other at a position adjacent to the notch 1211*c* in the state where the upper case 120 has the minimum dimension in the y direction. The present invention is, however, not particularly limited to this case. As exemplified in FIG. 26(*c*), an upper case 120B can include a main portion 1211B having an end surface 1211*d*B distant from a notch 1211*c*B.

The upper case 120A or 120B in FIG. 26(*b*) or 26(*c*), however, has the area R2 bonding the upper case 120B and the display panel, smaller than that in the upper case 120 according to the present embodiment. The upper case 120 is thus preferably configured as in the present embodiment in order to secure a large area bonding the upper case and the display panel. The display panel 200 can alternatively be fixed to the lower case 110 and the second member 1220 in the case unit 100 by a measure other than bonding.

The lower case 110 and the upper case 120 can be equal to or different from each other in thickness. The lower case 110 and the upper case 120 are, however, preferably equal in thickness in terms of design and usability of the fully opened display device 10 as depicted in FIGS. 7 to 10.

The upper case 120 according to the present embodiment has the minimum dimension in the y direction when the case unit 100 is in the fully opened state. The upper case 120 has the maximum dimension in the y direction when the case unit 100 is in the folded state. The present invention is, however, not particularly limited to this case. The upper case 120 can alternatively has a larger dimension in the y direction than the dimension in the fully opened case unit 100. Furthermore, the dimension in the y direction of the upper case 120 can be made smaller than the dimension in the folded case unit 100.

Embodiment 2

Figure 27:
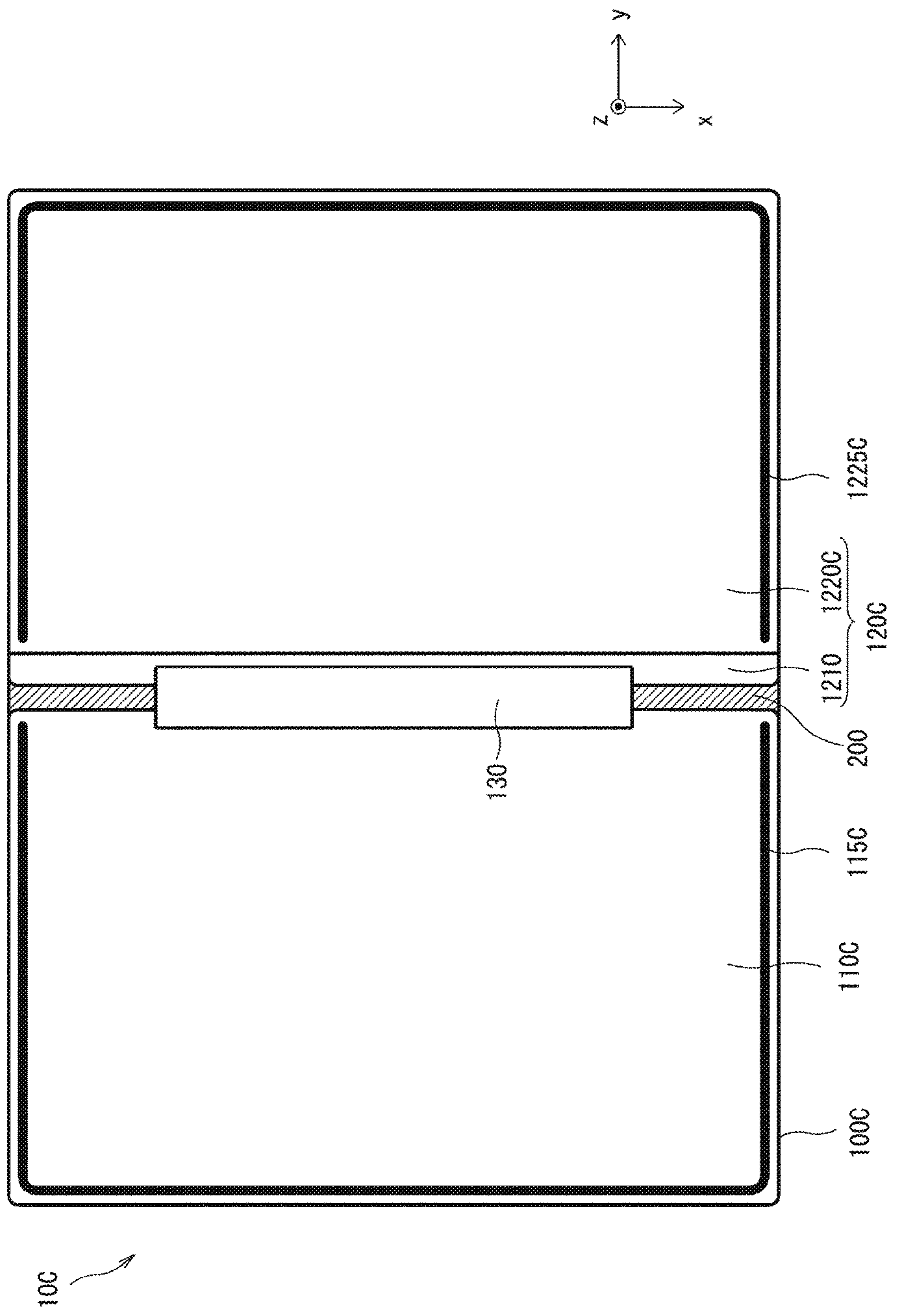
FIG. 27 is a plan view of a display device according to an embodiment 2 in a fully opened state.
Figure 28:
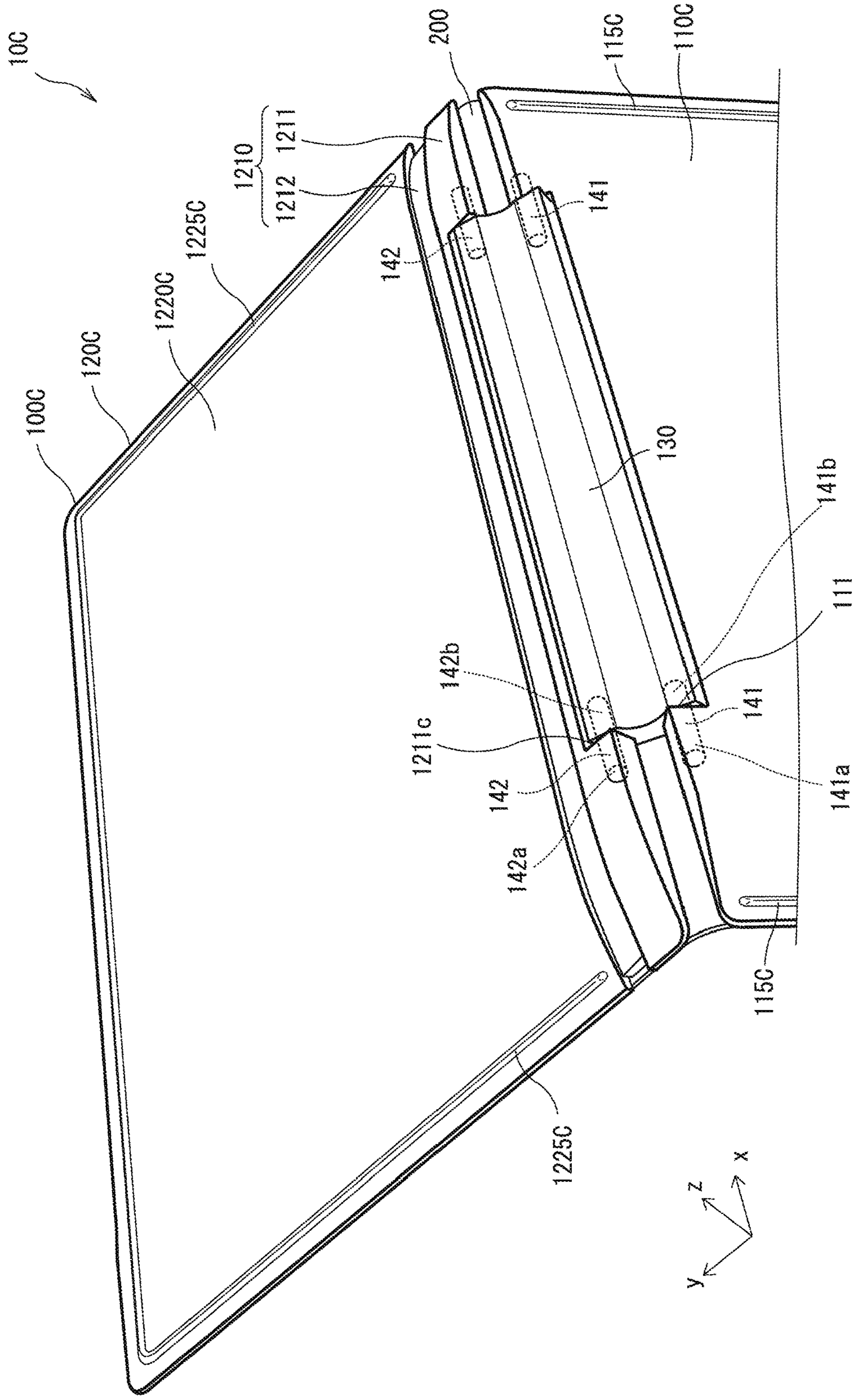
FIG. 28 is a perspective view of the display device according to the embodiment 2 in an opened state.

FIGS. 27 and 28 depict a display device 10C according to the embodiment 2. The display device 10C includes a case unit 100C and the display panel 200. The case unit 100C includes a lower case 110C, an upper case 120C, and the connecting plate 130. The upper case 120C includes the first member 1210 and a second member 1220C.

The lower case 110C includes a rib 115C provided at a surface opposite to a surface provided with the display panel 200. The rib 115C has a U shape following a peripheral edge portion of the lower case 110C. The rib 115C is 1 to 3 mm wide, for example. The rib 115C is 1 to 3 mm high, for example. The second member 1220C includes a rib 1225C provided at a surface opposite to a surface provided with the display panel 200. The rib 1225C has a U shape following the peripheral edge portion of the upper case 120. The rib 1225C is 1 to 3 mm wide, for example. The rib 1225C is 1 to 3 mm high, for example. The display device 10C according to the embodiment 2 is configured similarly to that according to the embodiment 1 except for the rib 115C and the rib 1225C.

In the display device 10C according to the embodiment 2, the lower case 110C is provided with the rib 115C, and the second member 1220C of the upper case 120C is provided with the rib 1225C. The display device 10C thus has excellent strength even in a case where the display device 10C is thin. Furthermore, the display device 10C is less likely to be dropped and the like because a user of the display device 10C can catch the rib 115C or the rib 1225C with a hand or a finger.

Figure 29:
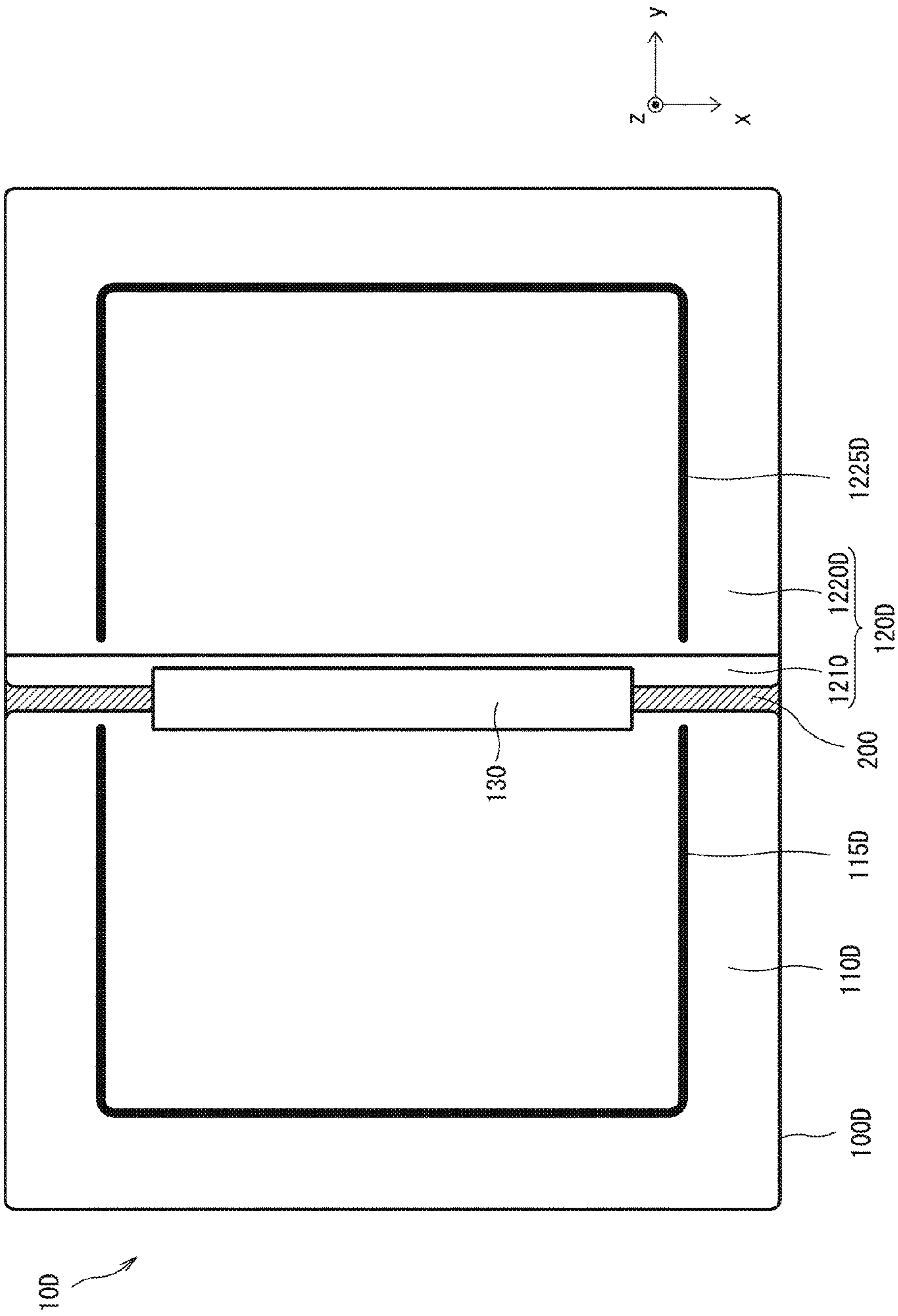
FIG. 29 is a plan view of a display device according to a modification example of the embodiment 2 in a fully opened state.

FIG. 29 depicts a display device 10D according to a modification example of the embodiment 2. The display device 10D includes a lower case 110D provided with a rib 115D, and an upper case 120D having a second member 1220D provided with a rib 1225D. The rib 115D is provided closer to the center of the lower case 110D than the rib 115C according to the embodiment 2. The rib 1225D is also provided closer to the center of the second member 1220D than the rib 1225C according to the embodiment 2. The rib 115D and the rib 1225D are provided close to the lower case 110D and the second member 1220D, respectively. The fully opened display device 10D is less likely to be dropped and the like because a user of the fully opened display device 10D can easily catch the rib 115D or the rib 1225D with a hand or a finger.

The embodiments described above are merely exemplified for implementation of the present invention. The present invention should not be limited to the above embodiments, and can be implemented with appropriate modifications to the above embodiments without departing from the spirit of the present invention.

INDUSTRIAL APPLICABILITY

The present invention is applicable to a foldable display device.

The invention claimed is:

1. A display device comprising a foldable case unit and a flexible display panel, wherein the case unit includes an elongated connecting plate, a first support member having a tubular shape and coupled to a first one of long sides of the connecting plate via a first hinge part, and a second support member having a tubular shape, coupled to a second one of the long sides of the connecting plate via a second hinge part, and having a variable dimension perpendicular to a longitudinal direction of the connecting plate, when the case unit is opened to allow the first and second support members to be flush with each other, the first support member, the connecting plate, and the second support member are aligned flush with one another in a direction perpendicular to the longitudinal direction of the connecting plate, and when the case unit is folded to allow the first and second support members to face each other, a dimension of the second support member in the direction perpendicular to the longitudinal direction of the connecting plate is larger than a dimension in the opened case unit, and the display panel is accommodated in a space surrounded with the first and second support members and the connecting plate, wherein the second support member includes a first member coupled to the second one of the long sides of the connecting plate via the second hinge part, and a second member coupled to the first member via an elastic member and disposed flush with the first member, the dimension of the second support member in the direction perpendicular to the longitudinal direction of the connecting plate is varied in accordance with variation in distance between the first and second members caused by expansion or contraction of the elastic member, the first member includes a main portion and an extending portion, the extending portion projecting from a surface of the main portion adjacent to the second member, a dimension of the main portion in a Z direction perpendicular to a main surface of the second member is larger than a dimension of the extending portion in the Z direction, the second member includes a first member accommodating portion to which the extending portion is inserted, a dimension of the first member accommodating portion at an end of the second member is an X direction parallel to a longitudinal direction of the connecting member is not less than a dimension of the extending portion in the X direction, and a dimension of the first member accommodating portion in a Y direction perpendicular to the X direction and the Z direction is not less than a dimension of the extending portion in the Y direction.

2. The display device according to claim 1, wherein the display panel is bonded to the first support member and the second member.

3. The display device according to claim 1, wherein a first one of the first and second members has a recess accommodating part of a second one of the first and second members, and the part of the second one accommodated in the recess is varied in depth vary the dimension of the second support member in the direction perpendicular to the longitudinal direction of the connecting plate.

4. The display device according to claim 3, wherein the recess is provided at the second member.

5. The display device according to claim 1, wherein the first member is smaller than the second member in dimension perpendicular to the longitudinal direction of the connecting plate.

6. The display device according to claim 1, wherein the dimension of the second support member has a maximum value substantially equal to a dimension of the first support member in the direction perpendicular to the longitudinal direction of the connecting plate.

7. The display device according to claim 1, wherein a sum of minimum value of the dimension of the second support member and a dimension of the connecting plate is substantially equal to the dimension of the first support member in the direction perpendicular to the longitudinal direction of the connecting plate.

8. The display device according to claim 1, wherein the display panel is a flexible organic EL display panel.

9. The display device according to claim 1, wherein the first support member includes a U-shaped notch to be coupled to a side of the connecting plate, and the U-shaped notch has a hole extending in the X direction to serve as a first hinge attachment configured to receive the first hinge part.

10. The display device according to claim 1, wherein the main portion includes a surface including a side coupled to the connecting plate, out of sides extending in the X direction, the surface being provided with a U-shaped notch, and the U-shaped notch has a hole extending in the X direction to serve as a second hinge attachment configured to receive the second hinge part.

11. The display device according to claim 1, further comprising a spring, wherein the extending portion of the first member is provided with a spring attachment hole extending from an end surface, adjacent to the second member, of the extending portion toward the main portion, the spring attachment hole has a bottom fixing a first end of the spring, the first member accommodating portion has inner walls including a surface that is most distant from an end surface to the second member and is provided with a spring attachment corresponding to the spring attachment hole of the first member, and a second end of the spring is fixed to a distal end of the spring attachment.

12. The display device according to claim 1, wherein the extending portion is provided with a shaft hole, the first member accommodating portion includes a shaft, and an end of the shaft is received in the shaft hole.

13. The display device according to claim 12, wherein the shaft hole penetrates from an end surface adjacent to the second member, of the extending portion, to an end surface adjacent to the main portion.

14. The display device according to claim 13, wherein the shaft hole has an inner wall surface provided with a step between the end surface adjacent to the second member and the end surface adjacent to the main portion, and the shaft hole in the end surface of the extending portion is larger in diameter than the shaft hole in the end surface adjacent to the second member.

15. The display device according to claim 12, wherein the extending portion of the first member is provided with a spring attachment hole, the spring attachment hole has a bottom fixing a first end of the spring, the first member accommodating portion has inner walls including a surface that is most distant from an end surface the second member and is provided with a spring attachment corresponding to the spring attachment hole of the first member, and the shaft hole is positioned closer to a surface including a side in the Y direction, of the extending portion, than the spring attachment hole is.

* * * * *